(12) United States Patent
Lu

(10) Patent No.: US 11,538,270 B2
(45) Date of Patent: Dec. 27, 2022

(54) DISPLAY PANEL AND DISPLAY DEVICE

(71) Applicant: Xiamen Tianma Micro-Electronics Co., Ltd., Xiamen (CN)

(72) Inventor: Feng Lu, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 17/305,232

(22) Filed: Jul. 1, 2021

(65) Prior Publication Data

US 2021/0334504 A1 Oct. 28, 2021

(30) Foreign Application Priority Data

Nov. 30, 2020 (CN) .......................... 202011380891.X

(51) Int. Cl.
| | |
|---|---|
| *G06F 3/041* | (2006.01) |
| *G06V 40/13* | (2022.01) |
| *G06F 3/044* | (2006.01) |
| *H01L 27/146* | (2006.01) |
| *H01L 27/32* | (2006.01) |
| *H04N 5/225* | (2006.01) |

(52) U.S. Cl.
CPC ........ *G06V 40/1318* (2022.01); *G06F 3/0412* (2013.01); *G06F 3/0443* (2019.05); *H01L 27/14623* (2013.01); *H01L 27/14678* (2013.01); *H01L 27/322* (2013.01); *H01L 27/323* (2013.01); *H01L 27/3234* (2013.01); *H01L 27/3244* (2013.01); *H04N 5/2256* (2013.01)

(58) Field of Classification Search
CPC . G06V 40/1318; G06F 3/0443; G06F 3/0412; H01L 27/14623; H01L 27/14678; H01L 27/322; H01L 27/323; H01L 27/3234; H01L 27/3244; H04N 5/2256
See application file for complete search history.

(56) References Cited

U.S. PATENT DOCUMENTS

2020/0395433 A1* 12/2020 Sung .................. G06V 40/1318
2021/0109617 A1* 4/2021 Lin ....................... G06F 3/0412

* cited by examiner

*Primary Examiner* — Abdul-Samad A Adediran
(74) *Attorney, Agent, or Firm* — Alston & Bird LLP

(57) ABSTRACT

Provided are a display panel and a display device. The display panel includes a base substrate, an array layer located at one side of the base substrate, a display layer located at one side of the array layer facing away from the base substrate, a color filter layer located at one side of the display layer facing away from the array layer, a touch layer located between the color filter layer and the display layer, a second light-shielding layer located at one side of the display layer facing away from the color filter layer and a light-sensing sensor layer. The color filter layer includes a first light-shielding layer and color resists, the first light-shielding layer includes multiple first imaging pin-holes; the second light-shielding layer includes multiple second imaging pin-holes corresponding to the first imaging pin-holes. The light-sensing sensor layer is used for detecting images generated via the second imaging pin-holes.

20 Claims, 14 Drawing Sheets

DISPLAY PANEL AND DISPLAY DEVICE

CROSS-REFERENCE TO RELATED APPLICATION

This application claims priority to Chinese Patent Application No. 202011380891.X filed on Nov. 30, 2020, the disclosure of which is incorporated herein by reference in its entirety.

TECHNICAL FIELD

The present disclosure relates to display technologies and, in particular, to a display panel and a display device.

BACKGROUND

As science and technology develop, various display devices with fingerprint recognition functions, such as mobile phones, tablet computers and intelligent wearable devices, have appeared on the market. Functions such as unlocking the display device and payment can be achieved by performing recognition on users' fingerprints, thereby simplifying the rights verification process and improving the user experience.

Currently, a sensor for the fingerprint recognition of an Organic Light-Emitting Diode (OLED) display device is usually provided on one side facing away from a display surface of the OLED display device. The basic principle of the fingerprint recognition of the OLED display device is as follows: beams generated by an external fingerprint recognition light source or by reusing an organic light-emitting element of the OLED display device reach a finger and a contact surface of the OLED display device, so that the beams are reflected after entering ridges and valleys of the fingerprint of the finger, and the reflected beams are received by a fingerprint recognition element, where the fingerprint recognition element performs imaging according to a corresponding imaging principle to implement fingerprint recognition. In the related art, in order to improve the accuracy of fingerprint imaging and detection, a light-shielding layer is provided in the OLED display device, and the light-shielding layer is provided with imaging pin-holes, so that the beams reflected back from the finger and the contact surface of the OLED display device can pass through the imaging pin-holes of the light-shielding layer and be received by the fingerprint recognition element, where the fingerprint recognition element performs imaging according to the pin-hole imaging principle to implement fingerprint recognition.

In addition, a touch function is also an essential function of current display device, and with the development trends of integration of the display device and making the display device thinner and lighter, integrating a touch structure into the display device (e.g., providing a touch layer on a thin film encapsulation layer of the OLED to form a TP on TFE structure) is conducive to improving integration level of the display device. However, due to existence of a metal layer or a metal oxide layer in the touch structure, a part of imaging beams may be directly reflected to the fingerprint recognition element, and the part of the beams do not carry any fingerprint information, thus adversely affecting the imaging effect and the fingerprint recognition accuracy of the OLED display device.

SUMMARY

A display panel and a display device are provided in embodiments of the present disclosure to improve the fingerprint recognition accuracy based on pin-hole imaging principle.

In a first aspect, an embodiment of the present disclosure provides a display panel, including:

a base substrate;

an array layer located at one side of the base substrate;

a display layer located at one side of the array layer facing away from the base substrate, where the display layer includes multiple light-emitting elements;

a color filter layer located at one side of the display layer facing away from the array layer, and the color filter layer includes a first light-shielding layer and color resists, where the first light-shielding layer includes multiple first imaging pin-holes, and the color resists correspond to the multiple light-emitting elements;

a touch layer located between the color filter layer and the display layer, where the first light-shielding layer shields the touch layer in a direction perpendicular to a plane where the base substrate is located;

a second light-shielding layer located at one side of the display layer facing away from the color filter layer, where the second light-shielding layer includes multiple second imaging pin-holes which correspond to the multiple first imaging pin-holes; and a light-sensing sensor layer, which is located at one side of the second light-shielding layer facing away from the display layer, and is used for detecting images generated via the multiple second imaging pin-holes;

the first imaging pin-hole is larger than the second imaging pin-holes, a part of beams emitted by the light-emitting element serving as a pin-hole imaging light source are reflected by the touch layer adjacent to the first imaging pin-hole and then incident onto a region of the second light-shielding layer outside the second imaging pin-hole.

In a second aspect, a display device is further provided in an embodiment of the present disclosure and the display device includes the display panel described above.

The display panel provided in the embodiments of the present disclosure includes a base substrate, an array layer located at one side of the base substrate, a display layer located at one side of the array layer facing away from the base substrate, a color filter layer located at one side of the display layer facing away from the array layer, a touch layer located between the color filter layer and the display layer, a second light-shielding layer located at one side of the display layer facing away from the color filter layer and a light-sensing sensor layer. The display layer includes multiple light-emitting elements; the color filter layer includes a first light-shielding layer and color resists, where the first light-shielding layer includes multiple first imaging pin-holes, and the color resists correspond to the multiple light-emitting elements; the first light-shielding layer shields the touch layer in a direction perpendicular to a plane of the base substrate; the second light-shielding layer includes multiple second imaging pin-holes which correspond to the multiple first imaging pin-holes; and the light-sensing sensor layer is located at one side of the second light-shielding layer facing away from the display layer and used for detecting images generated via the multiple second imaging pin-holes. The first imaging pin-hole is larger than the second imaging pin-hole, a part of beams emitted by the light-emitting element serving as a pin-hole imaging light source are reflected by the touch layer adjacent to the first imaging pin-hole and then incident onto a region of the second light-shielding layer outside the second imaging pin-hole. The color filter layer is provided and can absorb outside light, so that the outside light reflected by metal layers inside the light-emitting elements is prevented from affecting the display effect. The first imaging pin-holes are closer to the touch surface than the second imaging pin-holes, and the first imaging pin-holes are larger than the second imaging pin-holes, so that the first imaging pin-holes can be prevented from shielding imaging beams. By setting a location relationship among the second light-shielding layer, the second imaging pin-holes and the light-emitting elements serving as the pin-hole imaging light sources, part of emitted beams which do not arrive at the touch surface and are directly reflected on the touch layer are shielded by the second light-shielding layer, so that the part of emitted beams cannot pass through the second imaging pin-holes to reach light-sensing sensors, and the fingerprint recognition accuracy based on the pin-hole imaging principle is improved.

DETAILED DESCRIPTION

Figure 1:
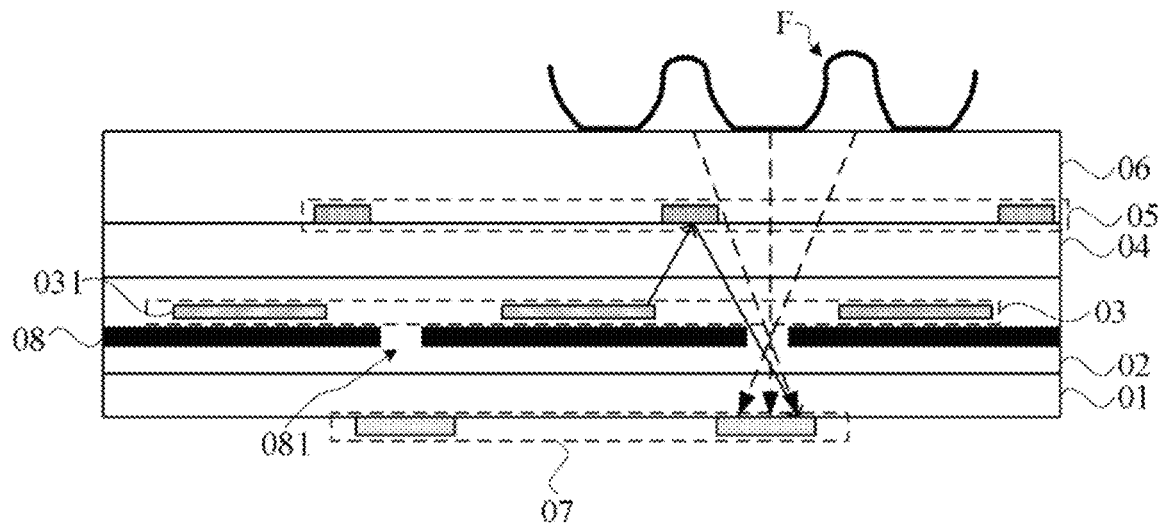
FIG. 1 is a structural diagram of a display panel in related technology.

Hereinafter the present disclosure will be further described in detail in conjunction with drawings and embodiments. It is to be understood that the embodiments set forth herein are intended to explain the present disclosure rather than to limit the present disclosure. Additionally, it is to be noted that for ease of description, merely part, not all, of the structures related to the present disclosure are illustrated in the drawings.

Terms used in the embodiments of the present disclosure are merely used to describe specific embodiments and not intended to limit the present disclosure. It is to be noted that nouns of locality, including "on", "under", "left" and "right", used in the embodiments of the present disclosure are described from perspective of the illustrated drawings and are not to be construed as limitations to the embodiments of the present disclosure. Additionally, in the context, it is to be understood that when an element is formed "on" or "under" another element, the element may be directly formed "on" or "under" another element, or may be indirectly formed "on" or "under" another element via an intermediate element. The terms "first", "second" and the like are merely used for description and used to distinguish between different components rather than indicate any order, quantity, or importance. For those of ordinary skill in the art, the above terms can be construed according to specific situations in the present disclosure.

FIG. 1 is a structural diagram of a display panel in related technology. Referring to FIG. 1, the display panel includes a base substrate 01, an array layer 02 located at one side of the base substrate 01, a display layer 03, an encapsulation layer 04, a touch layer 05 and a protective layer 06. The display layer 03 includes multiple light-emitting elements 031, and the array layer 02 may include multiple thin film transistors (TFTs) and pixel circuits (not shown in FIG. 1) composed of TFTs, the pixel circuits are used for driving the multiple light-emitting elements 031 in the display layer 03. The display panel further includes a light-sensing sensor layer 07 and a light-shielding layer 08. The light-shielding layer 08 is provided with multiple imaging pin-holes 081. The multiple light-emitting elements 031 in the display layer 03 are reused as fingerprint recognition light sources. After beams generated the light-emitting element 031 reach a fingerprint F and a contact surface of the protective layer 06, since fingerprint valleys and fingerprint ridges have different reflection degrees for the beams, the reflected beams are incident onto the light-sensing sensor layer 07 through the imaging pin-hole 081. In a case that a diameter of each imaging pin-hole 081 is small enough, a fingerprint image can be imaged to the light-sensing sensor layer 07 according to the pin-hole imaging principle to implement fingerprint recognition.

Since touch electrodes of the touch layer 05 are generally made of a metal or a metal oxide, a surface of the touch layer 05 has a certain reflection effect on the light; a part of the beams emitted from the light-emitting elements 031 may be directly reflected by the touch layer and cannot reach a surface of the protective layer 06. Since such part of beams do not carry fingerprint information, such beams, once striking onto the light-sensing sensor layer 07 through the imaging pin-hole 081, may cause interference on a fingerprint recognition signal and adversely affect the fingerprint imaging accuracy.

In view of the above, a display panel is provided in an embodiment of the present disclosure. The display panel includes a base substrate, an array layer located at one side of the base substrate, a display layer located at one side of the array layer facing away from the base substrate, a color filter layer located at one side of the display layer facing away from the array layer, a touch layer located between the color filter layer and the display layer, a second light-shielding layer located at one side of the display layer facing away from the color filter layer, and a light-sensing sensor layer. The display layer includes multiple light-emitting elements. The color filter layer includes a first light-shielding layer and color resists, where the first light-shielding layer includes multiple first imaging pin-holes, and the color resists are disposed corresponding to the multiple light-emitting elements. The first light-shielding layer shields the touch layer in a direction perpendicular to a plane where the base substrate locates. The second light-shielding layer includes multiple second imaging pin-holes, and the multiple second imaging pin-holes correspond to the multiple first imaging pin-holes. The light-sensing sensor layer is located at one side of the second light-shielding layer facing away from the display layer, and is used for detecting images generated via the multiple second imaging pin-holes. The first imaging pin-hole is larger than the second imaging pin-hole. A part of beams emitted by the light-emitting element serving as a pin-hole imaging light source are reflected by the touch layer adjacent to the first imaging pin-hole and then incident onto a region of the second light-shielding layer outside the second imaging pin-hole.

Figure 2:
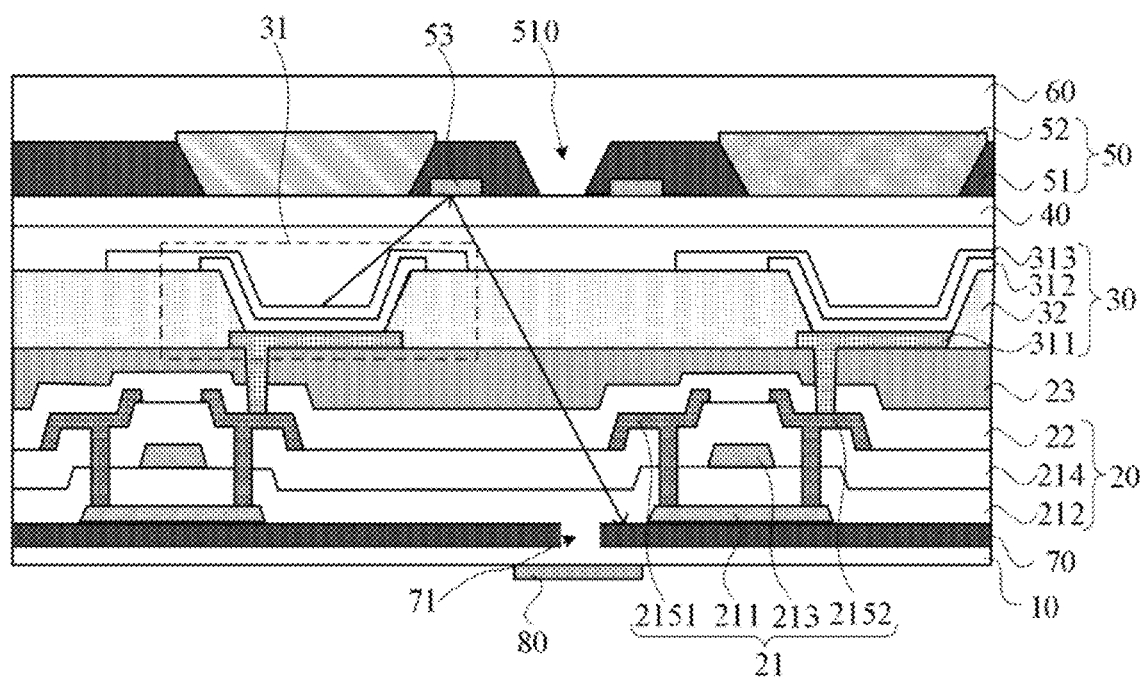
FIG. 2 is a structural diagram of a display panel according to an embodiment of the present disclosure.

FIG. 2 is a structural diagram of a display panel according to an exemplary embodiment of the present disclosure. Referring to FIG. 2, the display panel includes a base substrate 10, where the base substrate 10 may be flexible, i.e., the base substrate 10 may be extensible, foldable, bendable, or rollable, such that the display panel may be extensible, foldable, bendable, or rollable. The base substrate 10 may be made from any suitable insulating material having flexibility. The base substrate 10 is used for blocking oxygen and moisture, preventing moisture or impurities from diffusing through the base substrate 10. In addition, an upper surface of the base substrate 10 is formed as a flat surface. For example, the base substrate 10 may be formed of a polymer material such as polyimide (PI), polycarbonate (PC), polyether sulfone (PES), polyethylene terephthalate (PET), polyethylene naphthalate (PEN), polyarylate (PAR) or glass fiber reinforced plastic (FRP), and may be transparent, translucent or opaque. Optionally, the display panel may further include a buffer layer (not shown in FIG. 2) located on the base substrate 10, and the buffer layer may cover an entire upper surface of the base substrate 10. The base substrate 10 may alternatively be rigid, which may be, for example, a glass substrate, thereby forming a rigid display panel.

An array layer 20 is located at one side of the base substrate 10. Specifically, the array layer 20 is located at one side of the base substrate 10 facing towards a display surface or a touch surface of the display panel 10. The array layer 20 may include multiple thin film transistors 21 (TFTs) and pixel circuits composed of TFTs, where the pixel circuits are used for driving light-emitting elements in a display layer. Exemplarily, in the embodiment of the present disclosure, the structure description will be made in the case of top-gate type TFT. A TFT 21 includes an active layer 211 located on the base substrate 10, where the active layer 211 may be an amorphous silicon material, a polysilicon material, a metal oxide material or the like. The active layer 211, if made from the polysilicon material, may be formed using a low-temperature amorphous silicon technique, that is, the amorphous silicon material is formed into the polysilicon material by laser melting. In addition, various methods such as a rapid thermal annealing (RTA) method, a solid phase crystallization (SPC) method, an excimer laser annealing (ELA) method, a metal induced crystallization (MIC) method, a metal induced lateral crystallization (MILC) method, or a succession lateral solidification (SLS) may further be used for forming the active layer 211. The active layer 211 further includes a source region and a drain region formed by doping N-type impurity ions or P-type impurity ions, and a channel region is formed between the source region and the drain region. The array layer 20 further includes a gate insulating layer 212 located on the active layer 211, where the gate insulating layer 212 includes an inorganic layer such as silicon oxide, silicon nitride, and may include a single layer or multiple layers. The thin film transistor 21 further includes a gate 213 located on the gate insulating layer 212, where the gate 213 may include a single layer or multiple layers of gold (Au), silver (Ag), cuprum (Cu), nickel (Ni), platinum (Pt), palladium (Pd), aluminum (Al), molybdenum (MO) or chromium (Cr), or an alloy such as aluminum (Al): neodymium (Nd) or molybdenum (MO): wolfram (W). Selection may be made according to actual situations in the practical implementation. The array layer 20 further includes an interlayer insulating layer 214 located on the gate 213, where the interlayer insulating layer 214 may be formed by an inorganic insulating material such as silicon oxide or silicon nitride. Certainly, in other optional embodiments of the present disclosure, the interlayer insulating layer may be formed of an organic insulating material. The thin film transistor 21 further includes a source electrode 2151 located on the interlayer insulating layer 214 and a drain electrode 2152 located on the interlayer insulating layer 214. The source electrode 2151 and the drain electrode 2152 are electrically connected (or bonded) to the source region and the drain region, respectively, through contact holes, where the contact holes are formed by selectively removing the gate insulating layer 212 and the interlayer insulating layer 214.

The array layer 20 may further include a passivation layer 22. Optionally, the passivation layer 22 is located on the source electrode 2151 of the thin film transistor 21 and the drain electrode 2152 of the thin film transistor 21. The passivation layer 22 may be formed of an inorganic material such as silicon oxide or silicon nitride, or may be formed of an organic material. The display panel may further include a planarization layer 23. Optionally, the planarization layer 23 is located on the passivation layer 22. The planarization layer 23 includes an organic material such as acryl, polyimide (PI) or benzocyclobutene (BCB); and the planarization layer 23 has a planarization function.

The display layer 30 is located at one side of the array layer 20 facing away from the base substrate 10, and includes multiple light-emitting elements 31. Optionally, the display layer 30 is located on the planarization layer 23. The display layer 30 includes an anode layer 311, an organic light-emitting material 312 and a cathode layer 313, which are sequentially disposed in a direction away from the base substrate 10. The display panel 30 further includes a pixel defining layer 32 located at one side the anode layer 311 away from the array layer 20. The pixel defining layer 32 may be made from an organic material such as polyimide (PI), polyamide, benzocyclobutene (BCB), acrylic resin or phenolic resin, or may be made from an inorganic material such as silicon nitride (SiNx).

Optionally, the anode layer 311 includes multiple anode patterns which have a one-to-one correspondence with pixels. The anode patterns in the anode layer 311 are connected to the source electrodes 2151 or the drain electrodes 2152 of the thin film transistors 21 through via-holes in the planarization layer 23. The pixel defining layer 32 is provided with multiple openings through which the anode layer 311 is exposed, and covers edges of patterns of the anode layer 311. At least a part of the organic light-emitting material 312 is filled in the openings of the pixel defining layer 32 and is in contact with the anode layer 311.

Optionally, the anode layer 311, the organic light-emitting material 312, and the cathode layer 313 defined by each opening of the pixel defining layer 32 constitute one light-emitting element 31 (which is as shown in a dashed box in FIG. 2). Each light-emitting element 31 may emit light with different colors according to different organic light-emitting materials 312. Each light-emitting element 31 constitutes one sub-pixel, and multiple sub-pixels jointly perform display of a picture.

Optionally, the display panel further includes an encapsulation layer 40 located on the display layer 30, and the encapsulation layer 40 completely covers the display layer 30 to seal the display layer 30. Optionally, the encapsulation layer 40 may be a thin film encapsulation layer, where the thin film encapsulation layer is located on the cathode layer 313 and includes an inorganic encapsulation layer, an organic encapsulation layer and an inorganic encapsulation layer sequentially disposed along the direction away from the base substrate 10 for preventing moisture and oxygen from corroding the light-emitting elements 31. In other optional embodiments of the present disclosure, the encapsulation layer 40 may include stacked organic and inorganic material layers in any number as desired, but at least one organic material layer and at least one inorganic material layer are alternately deposited, and the lowermost layer and the uppermost layer are inorganic material layers.

Figure 3:
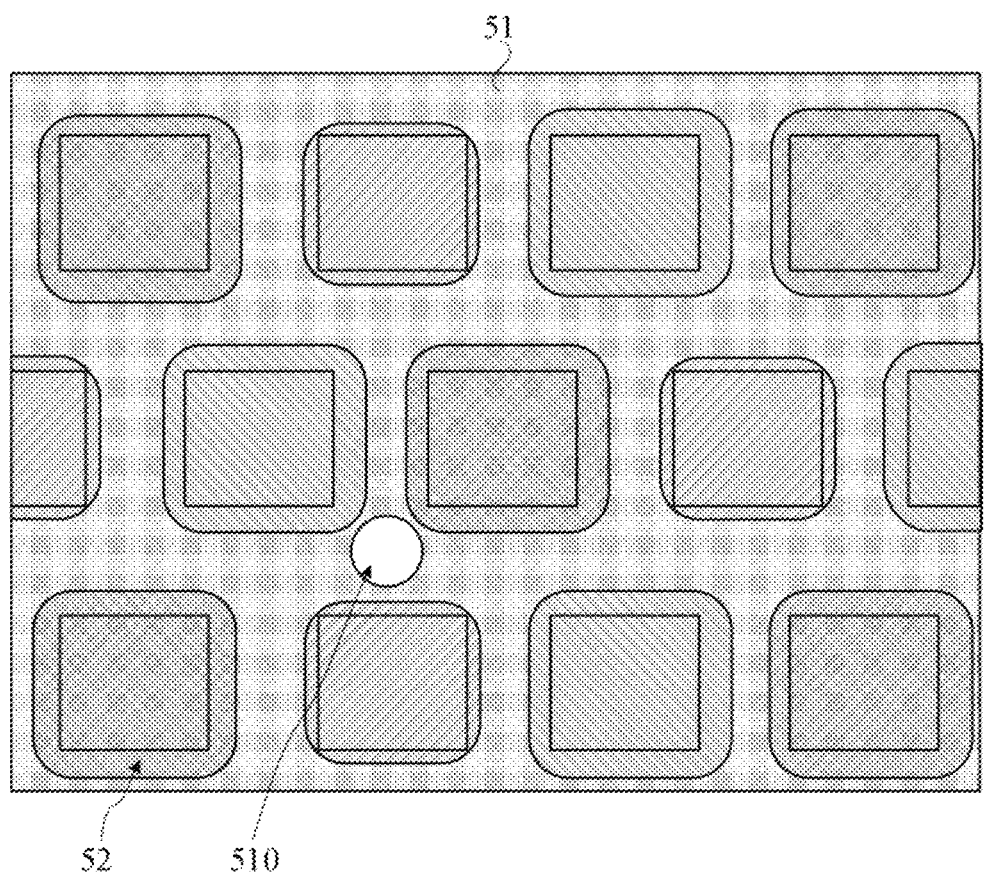
FIG. 3 is a top view of a color filter layer according to an embodiment of the present disclosure.

A color filter layer 50 is located at one side of the display layer 30 facing away from the array layer 20, and includes a first light-shielding layer 51 and color resists 52, where the first light-shielding layer 51 is provided with multiple first imaging pin-holes 510, and the color resists 52 correspond to the light-emitting elements 31. Exemplarily, FIG. 3 is a top view of a color filter layer according to an embodiment of the present disclosure. A region filled by dots is a region covered by the first light-shielding layer 51, regions surrounded by rounded rectangles are regions covered by the color resists 52, and rectangles denote regions corresponding to the light-emitting elements. Specifically, the first light-shielding layer 51 is a black matrix (BM). The first light-shielding layer 51 may be a mesh structure, openings of the mesh structure correspond to the light-emitting elements. One opening defines one color resist 52, where regions between the rounded rectangles and the rectangles are regions in which the color resists 52 overlap with the first light-shielding layer 51. The color resists 52 having different colors are spaced by the first light-shielding layer 51. The color resists 52 are disposed in a one-to-one correspondence with the light-emitting elements. The color resists 52 include color resist materials having different colors, and the color resists materials are of the same colors as the light-emitting elements. It is to be noted that the correspondence of two components herein may be understood that orthographic projections of the two components onto the base substrate at least partially overlap. The color resists 52 may be arranged instead of providing a circular polarizer on the display layer 30.

Still referring to FIG. 2, the display panel may further include a protective layer 60 on the color filter layer 50. Optionally, the protective layer 60 is the outermost film layer of the display panel and may be a protective cover plate or a cover film. The protective layer 60 may be bonded to a film layer inside the display panel adjacent to the protective layer by means of an optically clear adhesive (OCA), and a surface of the protective layer 60 is an operation surface for touch control or fingerprint recognition of the display panel.

The display panel further includes a touch layer 53 located between the color filter layer 50 and the display layer 30, and the first light-shielding layer 51 shields the touch layer 53 in a direction perpendicular to the plane where the base substrate 10 is located. The touch layer 53 is used for achieving the touch function of the display panel. In specific implementation, a self-capacitance manner or a mutual-capacitance manner may be used. The first light-shielding layer 51 (i.e., the black matrix) covers the touch layer 53 to prevent the touch pattern from being visible in a non-display state.

It is to be understood that FIG. 2 shows a cross-sectional view of a display panel. The touch layer 53 includes a touch electrode. Specifically, a structure of the touch electrode may be a metal mesh, the touch electrode includes multiple metal wires extending in a first direction and multiple metal wires extending in a second direction, and the metal wires extending in different directions cross to form a mesh. The metal wires are located within a shielding range of the first light-shielding layer 51, i.e., the metal wires form mesh lines of the mesh structure corresponding to the first light-shielding layer 51.

The display panel further includes a second light-shielding layer 70 located at one side of the display layer 30 facing away from the color filter layer 50, where the second light-shielding layer 70 includes multiple second imaging pin-holes 71, and the multiple second imaging pin-holes 71 correspond to the multiple first imaging pin-holes 510. A light-sensing sensor layer 80 is located at one side of the second light-shielding layer 70 facing away from the display layer 30, and which is used for detecting images generated via the multiple second imaging pin-holes 71. The first imaging pin-hole 510 is larger than the second imaging pin-hole 71, such that the first imaging pin-hole 510 is avoided from shielding imaging beams. Part of beams emitted by the light-emitting element serving as the pin-hole imaging light source are reflected by the touch layer adjacent to the first imaging pin-hole 510 and then incident onto a region of the second light-shielding layer 70 outside the second imaging pin-hole 71. Optionally, a diameter of the second imaging pin-hole 71 ranges from 5 microns to 20 microns. On the one hand, the diameter of the second imaging pin-hole 71 is less than 20 microns to ensure that the pin-hole for transmitting beams is small enough to achieve pin-hole imaging. On the other hand, the diameter of the second imaging pin-hole 71 is larger than 5 microns to satisfy the process accuracy requirements for forming the imaging pin-hole and reduce the process difficulty.

Figure 4:
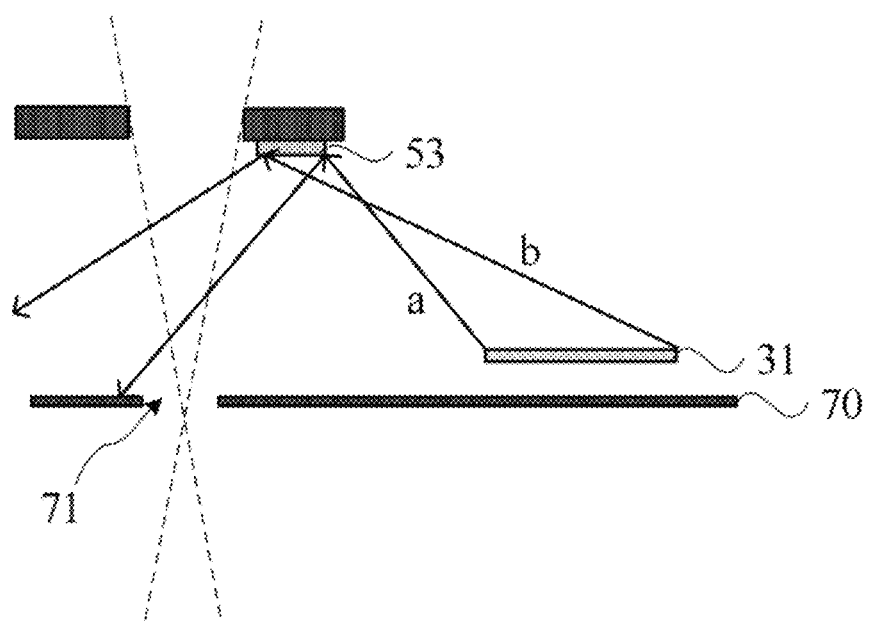
FIG. 4 schematically illustrates a partial cross-sectional view of a display panel taken along a direction perpendicular to a base substrate according to an embodiment of the present disclosure.

FIG. 4 schematically shows a partial cross-sectional view of a display panel taken along a direction perpendicular to a base substrate according to an exemplary embodiment of the present disclosure. FIG. 4 also schematically illustrates optical paths in which beams emitted by the light-emitting element 31, serving as the pin-hole imaging light source, are incident onto the touch layer 53. The beam a emitted from the left end of the light-emitting element 31 and the beam b emitted from the right end of the light emitting element 31 are both shielded by the second light-shielding layer 70 after being reflected by the touch layer 53, and cannot be transmitted through the second imaging pin-hole 71, thereby avoiding being received by the light-sensing sensor (not shown in FIG. 4) and improving the fingerprint recognition accuracy.

In the solution of the embodiment of the present disclosure, the color filter layer is provided and can absorb outside light, so that the outside light reflected by metal layers inside the light-emitting elements is prevented from affecting the display effect. The first imaging pin-holes are closer to the touch surface than the second imaging pin-holes, and the first imaging pin-holes are larger than the second imaging pin-holes, so that the first imaging pin-holes can be prevented from shielding the imaging beams. By setting a location relationship among the second light-shielding layer, the second imaging pin-holes and the light-emitting elements serving as the pin-hole imaging light sources, part of emitted beams which do not arrive at the touch surface and are directly reflected on the touch layer are shielded by the second light-shielding layer, so that the part of emitted beams cannot pass through the second imaging pin-holes to reach light-sensing sensors, and the fingerprint recognition accuracy based on the pin-hole imaging principle is improved.

Based on the above embodiment, optionally, the touch layer 53 includes at least one layer of touch electrodes, and the touch electrode includes a touch pattern 531. A location relationship between the touch pattern 531 adjacent to the first imaging pin-hole 510 and the light-emitting element 31 serving as the pin-hole imaging light source satisfies the following formula:

$$x \geq D + W + x_1 \quad (1)$$

In the above formula (1), x denotes a distance between an edge of the touch pattern 531 and an edge of the light-emitting element 31 serving as the pin-hole imaging light source in a first direction, D denotes a width of the second imaging pin-hole 71 in the first direction, W denotes a width of the touch pattern 531 in the first direction and $x_1$ denotes a distance between an edge of the touch pattern 531 and the second imaging pin-hole 71 in the first direction, where the first direction is parallel to a plane where the second light-shielding layer 70 is located.

Figure 5:
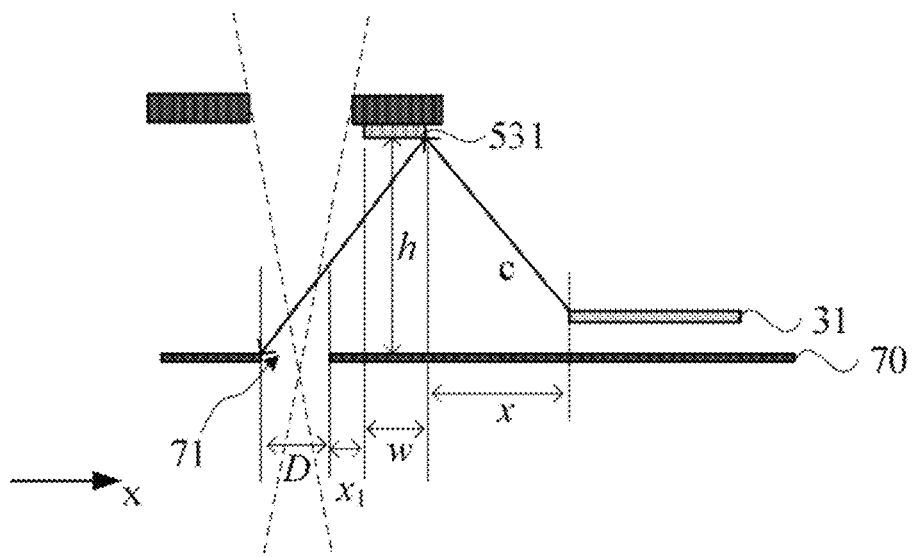
FIG. 5 schematically illustrates a partial cross-sectional view of another display panel taken along a direction perpendicular to a base substrate according to an embodiment of the present disclosure.

In the present embodiment, the touch layer may form a self-capacitance touch electrode or may form a mutual-capacitance touch electrode; selection may be made according to actual conditions. FIG. 5 schematically shows a partial cross-sectional view of a display panel taken along a direction perpendicular to a base substrate according to another exemplary embodiment of the present disclosure. FIG. 5 also shows a schematic diagram of an optical path in which a beam emitted by the light-emitting element 31 serving as the pin-hole imaging light source is incident onto the touch pattern 531 in the touch layer. FIG. 5 shows a critical case in which a beam c emitted from the left end of the light-emitting element 31 strikes exactly at an edge of the second image pin-hole 71 after being reflected at a right end edge of the touch pattern 531. In this case, a distance between the touch pattern 531 and the light-emitting element 31 is $x_0 = D + W + x_1$, where D denotes a width of the second imaging pin-hole 71 in the first direction x, W denotes a width of the touch pattern 531 in the first direction x, and $x_1$ denotes a distance between an edge of the touch pattern 531 and the second imaging pin-hole 71 in the first direction x, that is, a minimum distance between a perpendicular projection of the touch pattern 531 onto the second light-shielding layer 70 and an edge of the second imaging pin-hole 71. The first direction x is parallel to a plane where the second light-shielding layer 70 is located. The distance between the touch pattern 531 and the light-emitting element 31 is set greater than or equal to $x_0$, so that the second light-shielding layer 70 shields beams which are directly reflected by the touch pattern 531 and beams which are possibly transmitted through the first imaging pin-hole 510, without carrying the fingerprint information; thereby reducing the intensity of interference light and improving the fingerprint recognition accuracy.

Optionally, the distance $x_1$ between the edge of the touch pattern 531 and the second imaging pin-hole 71 in the first direction satisfies the following formula:

$$x_1 \geq h \tan \gamma \quad (2)$$

Where γ denotes an effective viewing angle in a case where imaging is performed via the second imaging pin-hole 71, and $$\tan \gamma = \frac{\sqrt{2}\, P}{2u},$$

where P denotes a distance between two adjacent second imaging pin-holes 71 in the first direction, u denotes a distance between a touch surface and the second light-shielding layer 70 in a second direction, and h denotes a distance between the touch pattern 531 and the second light-shielding layer 70 in the second direction, where the second direction is perpendicular to the plane where the second light-shielding layer 70 is located.

Figure 6:
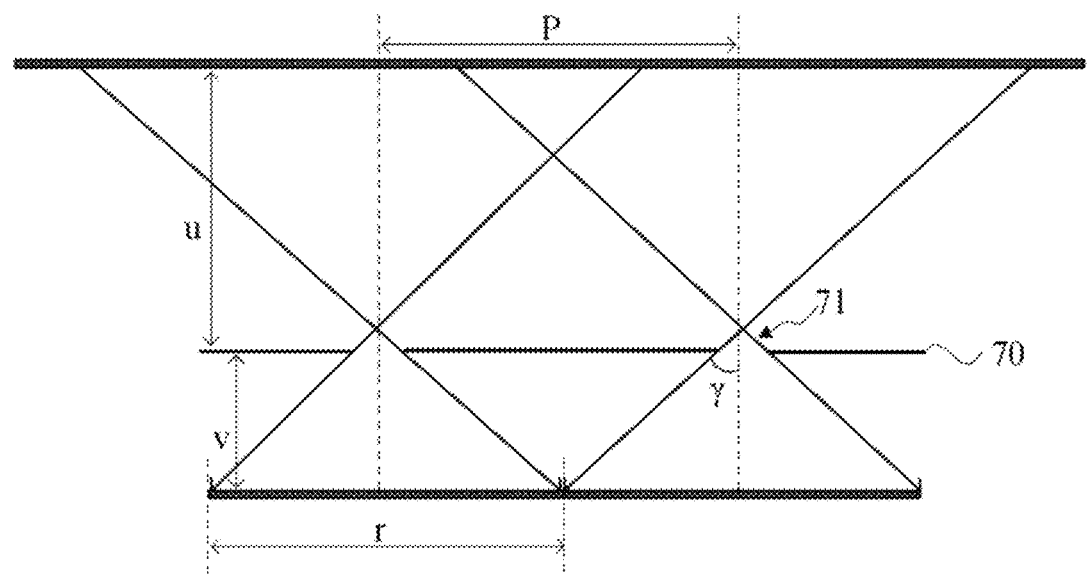
FIG. 6 is a schematic diagram of a fingerprint recognition imaging principle based on pin-hole imaging.
Figure 7:
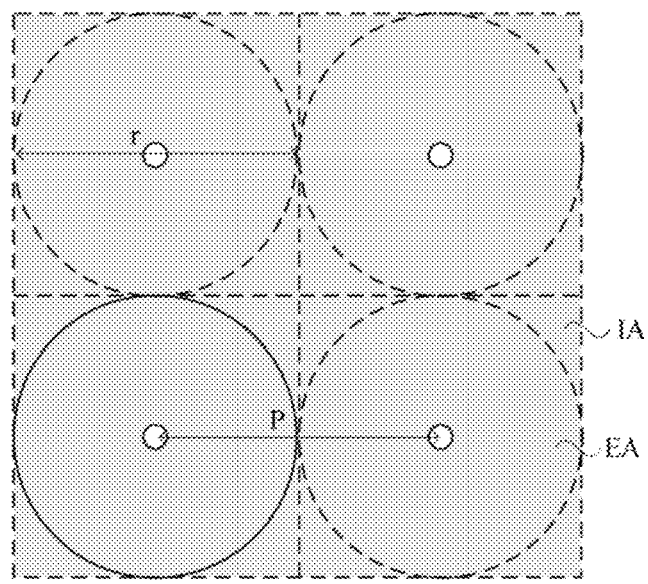
FIG. 7 is a schematic diagram of an imaging area in FIG. 6.

FIG. 6 is a schematic diagram of an exemplary fingerprint recognition imaging principle based on pin-hole imaging. FIG. 7 is a schematic diagram of an imaging area in FIG. 6. Referring to FIGS. 6 and 7 concurrently, in a condition that an angle of view γ of an imaging pin-hole, an object distance u, an image distance v and other parameters are fixed, taking a shape of the imaging pin-hole as circular as an example, an imaging area IA of one imaging pin-hole on the light-sensing sensor layer is a circular region with a radius of P/2. The light-sensing sensor layer includes one or more light-sensing fingerprint sensors, one detection area EA is provided corresponding to each imaging area IA, multiple light-sensing sensors are provided in the detection area EA to detect the each imaging area IA, and finally the fingerprint recognition is performed according to images detected by all detection areas EA. In order to ensure the angle of view of the pin-hole imaging, $$\gamma = \arctan\left(\frac{\sqrt{2}\,P}{2u}\right).$$

The distance $x_1$ between the edge of the touch pattern and the second imaging pin-hole in the first direction is set to satisfy the above formula (2), so that the touch layer is avoided from shielding imaging beams.

Optionally, the touch layer 53 includes at least one layer of touch electrodes, and the touch electrode includes a touch pattern 531. A location relationship between the touch pattern 531 adjacent to the first imaging pin-hole 510 and the light-emitting element 31 serving as the pin-hole imaging light source satisfies the following formula:

$$x \geq D + W + h \cdot \tan\theta \qquad (3)$$

where x denotes a distance between an edge of the touch pattern 531 and an edge of the light-emitting element 31 serving as the pin-hole imaging light source in a first direction, D denotes a width of the second imaging pin-hole 71 in the first direction, W denotes a width of the touch pattern 531 in the first direction, h denotes a distance between the touch pattern 531 and the second light-shielding layer 70 in a second direction, and θ denotes a critical angle at which a beam incident onto a surface of a first dielectric layer far away from a photosensitive surface of the light-sensing sensor layer 80 is totally reflected, where the first dielectric layer is a film layer adjacent to the photosensitive surface of the light-sensing sensor layer 80. The first direction is parallel to a plane where the second light-shielding layer 70 is located and the second direction is perpendicular to the plane where the second light-shielding layer 70 is located. Optionally, the first dielectric layer is an air layer.

In some embodiments, the light-sensing sensor layer is attached onto one side of the base substrate facing away from the display layer through a frame adhesive, and an air gap is provided between the light-sensing sensor layer and the base substrate. For a part of beams which are reflected by the touch pattern and transmitted through the second imaging pin-hole, if angles of incidence of beams incident onto an interface of the base substrate and the air gap are relatively large, such as greater than or equal to the critical angle of total reflection here, this part of beams cannot be incident onto the light-sensing sensor layer and cannot cause interference; hence, by setting the distance between the edge the touch pattern and the edge of the light-emitting element serving as the pin-hole imaging light source in the first direction to satisfy the above formula (3), the beams reflected by the touch pattern can be prevented from striking onto the light-sensing sensor layer.

In specific implementation, the refractive index of the base substrate and the refractive index of a cover plate of the display panel are generally approximate. For example, when both of the base substrate and the cover plate are glass materials, the refractive index is about 1.5, and the critical angle of total reflection is about 41.8 degrees, which is also the maximum angle of view of pin-hole imaging. Therefore, θ in the above formula (3) may be 41.8 degrees, thus improving the fingerprint recognition accuracy under the condition that the touch patterns do not affect the viewing field of pin-hole imaging.

Optionally, the display layer includes light-emitting elements having at least three light-emitting colors, where light-emitting elements of one color serve as pin-hole imaging light sources, and the first imaging pin-holes and the second imaging pin-holes are located between light-emitting elements having different colors from the light-emitting elements serving as the pin-hole imaging light sources. Optionally, the light-emitting elements include red light-emitting elements, green light-emitting elements and blue light-emitting elements, and the green light-emitting elements serve as the pin-hole imaging light sources.

Figure 8:
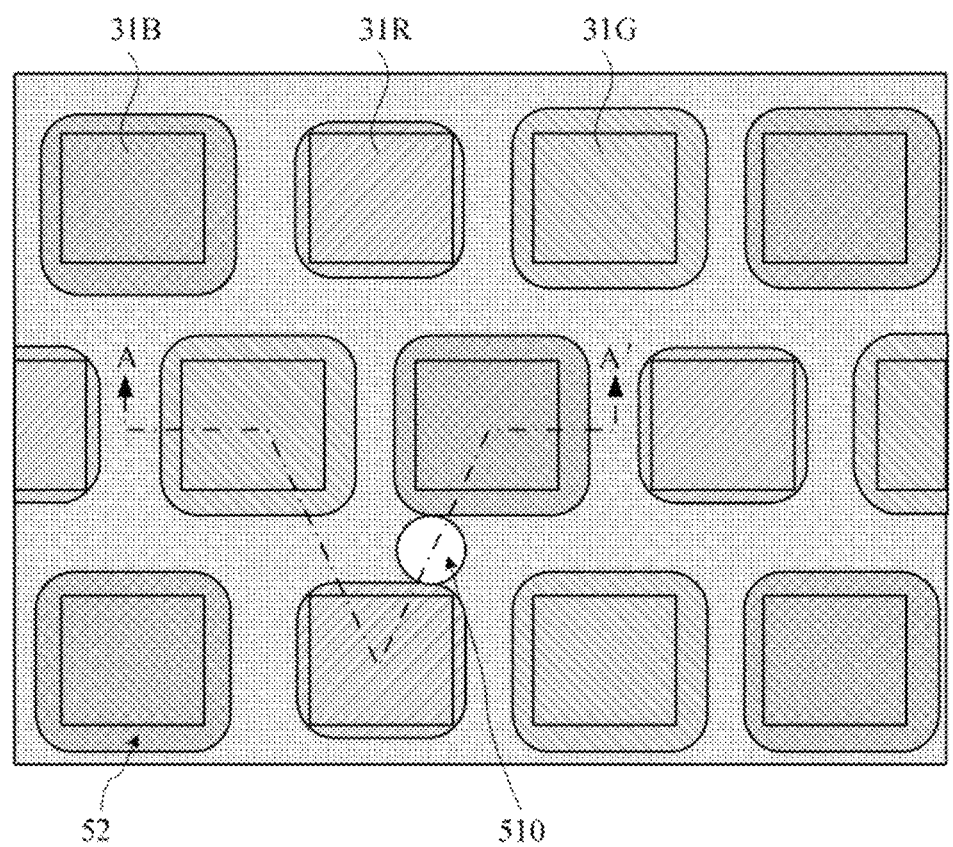
FIG. 8 schematically illustrates a partial top view of a display panel according to an embodiment of the present disclosure.
Figure 9:
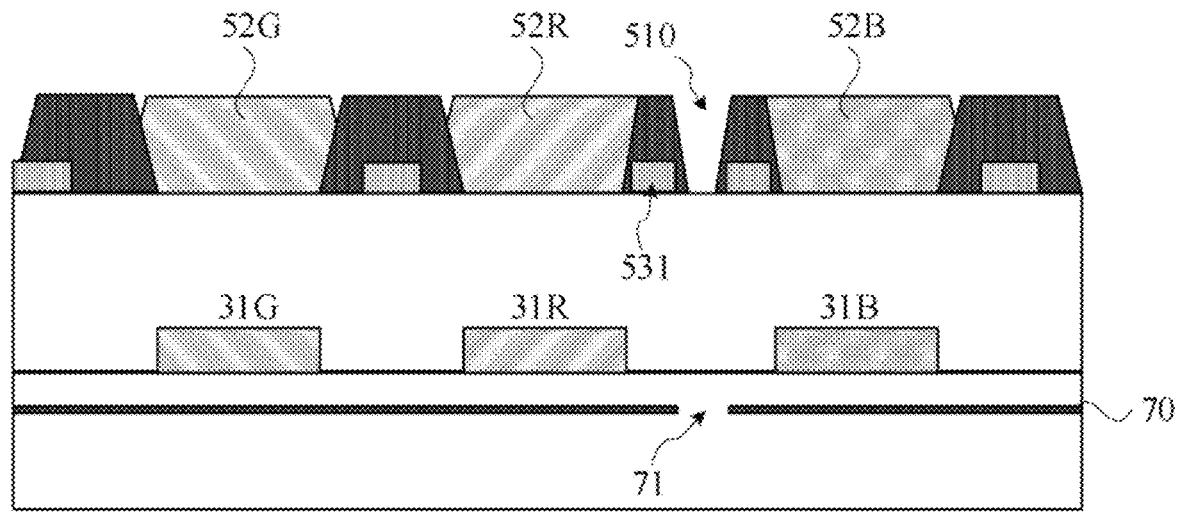
FIG. 9 schematically illustrates a cross-sectional view taken along line AA' of FIG. 8.

FIG. 8 is a partial top view of a display panel according to another exemplary embodiment of the present disclosure. FIG. 9 is a cross-sectional view taken along line AA' of FIG. 8. For simplification, a part of the structure of the display panel is simplified in FIG. 9, and the following embodiment is the same. Referring to FIGS. 8 and 9 concurrently, the display layer includes the light-emitting elements having three light-emitting colors, the light-emitting elements are respectively the red light-emitting elements 31R, the green light-emitting elements 31G and the blue light-emitting elements 31B, and the three kinds of light-emitting elements are arranged in a delta shape. The green light-emitting elements 31G are used as the pin-hole imaging light sources. The first imaging pin-hole 510 and the second imaging pin-hole 71 are located between the red light-emitting element 31R and the blue light-emitting element 31B. This arrangement facilitates increasing an angle of incidence at which a beam emitted by the pin-hole imaging light source is incident onto a touch pattern 931 adjacent to the first imaging pin-hole 510, so as to prevent a reflected beam from entering the second imaging pin-hole 71.

In other embodiments, in order to reduce the reflection at the touch layer, color resists may be formed under the touch layer. Optionally, at least one color resist extends between the touch layer and the display layer, the color of a color resist material between at least part of the touch layer and the display layer is different from the light-emitting color of the light-emitting elements serving as the pin-hole imaging light sources.

Figure 10:
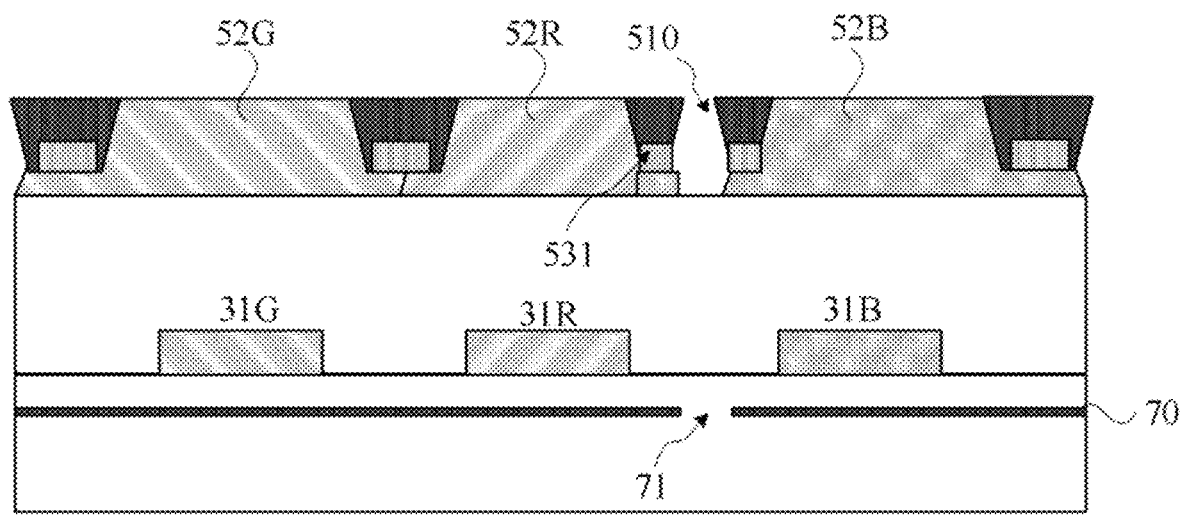
FIG. 10 schematically illustrates another cross-sectional view taken along line AA' of FIG. 8.

FIG. 10 is across-sectional view taken along line AA' of FIG. 8 in accordance with another exemplary embodiment. Referring to FIG. 10, a blue color resist 52B extend under the touch patterns 531, thereby absorbing part of beams from the light-emitting elements 31G as the pin-hole imaging light sources, further reducing the probability that the touch patterns 531 reflect the beams to the second imaging pin-hole 71 and improving the fingerprint recognition effect.

In other embodiments, the red color resist 52R may extend under the touch patterns 531, or the blue color resist 52B and the red color resist 52R may both extend under the touch patterns 531. Optionally, two color resists are stacked between the touch layer adjacent to an identical first imaging pin-hole 510 and the display layer in the direction perpendicular to the plane where the base substrate is located, and the colors of the two color resists are different from the light-emitting color of the light-emitting elements serving as the pin-hole imaging light sources.

Figure 11:
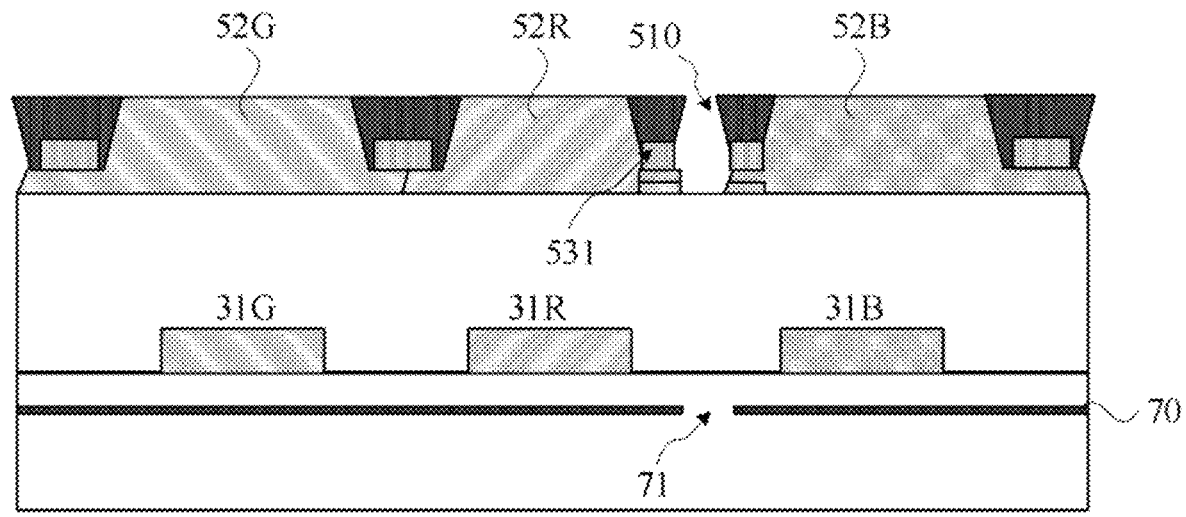
FIG. 11 schematically illustrates another cross-sectional view taken along line AA' of FIG. 8.

FIG. 11 is a cross-sectional view taken along line AA' of FIG. 8 in accordance with another exemplary embodiment. Referring to FIG. 11, the red color resist 52R and the blue color resist 52B both extend under the touch patterns 531 and are stacked under the touch patterns 531, thereby absorbing part of beams from the light-emitting elements 31G as the pin-hole imaging light sources, further reducing the probability that the touch layer 53 reflects the beams to the second imaging pin-hole 71 and improving the fingerprint recognition effect.

In addition, when the color resists of two colors are stacked under the touch patterns 531, the color resists under the touch layer may absorb light of two colors. For example, blue color resists 52B and red color resists 52R may be provided under a part of touch patterns 531, and green light-emitting elements 31G are used as pin-hole imaging light sources. Red color resists 52R and green color resists 52G are provided under another part of the touch patterns 531, and blue light emitting-elements 31B are used as pin-hole imaging light sources, so that the two-color light sources are used as the fingerprint recognition light sources for performing twice fingerprint recognitions in a time-division manner, so as to improve the fingerprint recognition accuracy.

Optionally, at least partial touch layer is covered by the color resist, and the color resist covers at least a part of a sidewall of the first imaging pin-hole 510.

Figure 12:
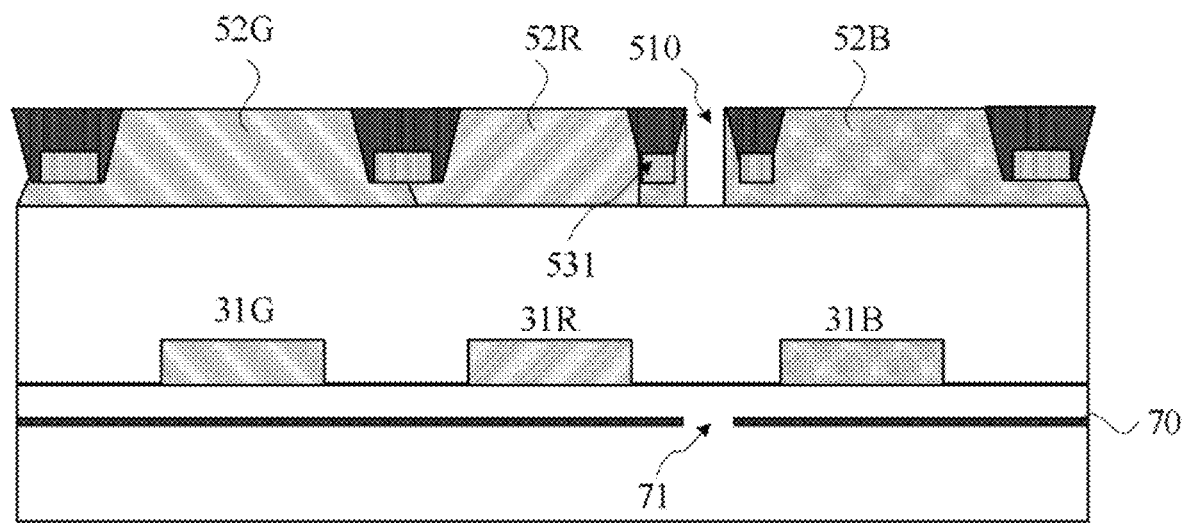
FIG. 12 schematically illustrates another cross-sectional view taken along line AA' of FIG. 8.

FIG. 12 is another cross-sectional view taken along line AA' of FIG. 8 in accordance with another exemplary embodiment. Referring to FIG. 12, a part of blue color resist 52B extends under the touch patterns 531 and covers the sidewall of the first imaging pin-hole 510, thereby preventing sidewalls of the touch patterns 531 or the sidewall of the first imaging pin-hole 510 from reflecting light.

Optionally, the color resist at least partially covers the touch layer along a direction from the base substrate to the display layer.

Figure 13:
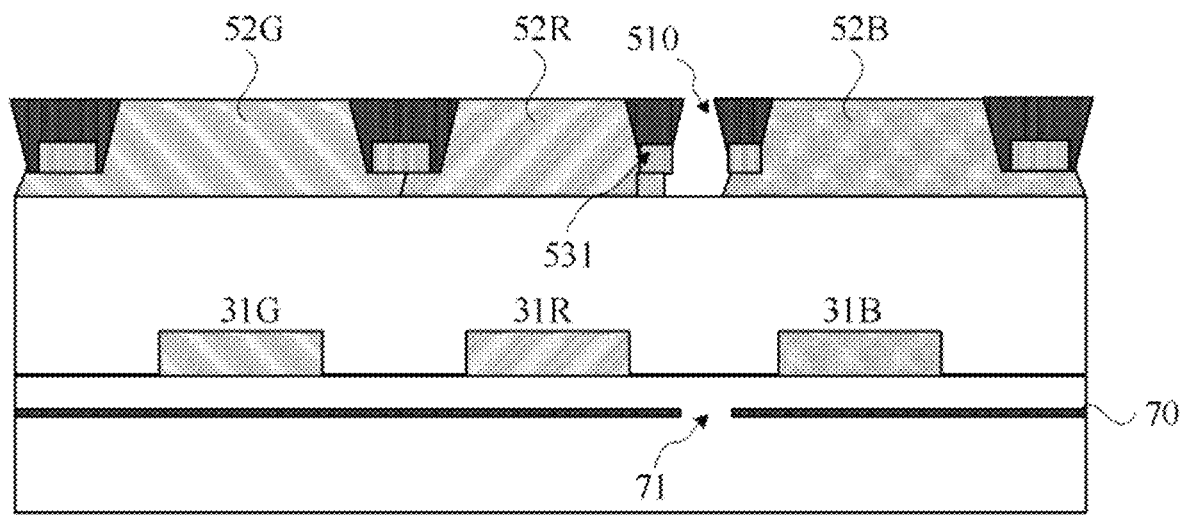
FIG. 13 schematically illustrates another cross-sectional view taken along line AA' of FIG. 8.

It is understood that the blue color resist 52B shown in FIG. 10 completely covers the touch patterns 531 adjacent to the first imaging pin-hole 510, which is only schematic. In specific implementation, the width of the color resist may be smaller than the width of the touch pattern due to process reasons. Optionally, the width of touch patterns 531 adjacent to the first imaging pin-hole 510 is smaller than the width of the color resists between the touch patterns 531 and the display layer. FIG. 13 is another cross-sectional view taken along line AA' of FIG. 8 in accordance with another exemplary embodiment. Referring to FIG. 13, a part of blue color resist 52B extends under the touch patterns 531, and the width of the touch pattern 531 on the left of the first imaging pin-hole 510 is larger than the width of the blue color resist 52B under such touch pattern 531.

The touch layer is generally made of a metal oxide (such as an indium tin oxide (ITO)) to form a block or strip touch electrode structure. In other embodiments, metal wires can be made of silver or copper to form the touch electrodes having a metal mesh structure, which have the advantages of low resistance, high transmittance, high stability and bendability. Optionally, the touch layer includes multiple mesh-shaped touch electrodes, the mesh-shaped touch electrodes include multiple intersecting metal lines, and the metal lines extend along intervals between the sub-pixels formed by the light emitting elements, that is, the metal lines correspond to the first light-shielding layer.

Figure 14:
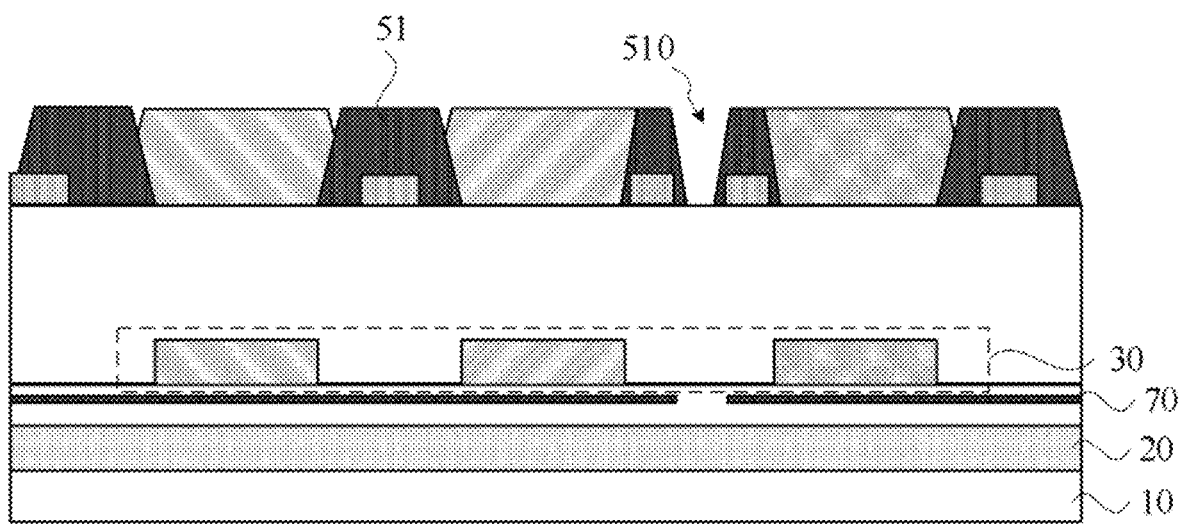
FIG. 14 is a structural diagram of a display panel according to another embodiment of the present disclosure.

The display panel provided in the present embodiment includes the first light-shielding layer (the black matrix) located in the color filter layer and the second light-shielding layer located under the first light-shielding layer, and a location of the second light-shielding layer is not defined in specific implementation. Optionally, the second light-shielding layer is located between the display layer and the array layer. FIG. 14 is a structural diagram of another display panel according to another exemplary embodiment of the present disclosure. Referring to FIG. 14, the second light-shielding layer 70 is disposed between the display layer 30 and the array layer 20. In specific implementation, the second light-shielding layer 70 may be made of a metal material or the same material as the first light-shielding layer 51 according to actual requirements in specific implementation. By adding an independent second light-shielding layer 70 between the display layer 30 and the array layer 20, it is possible to reduce the process difficulty without changing other film layer structures.

Since a driving circuit for driving the light-emitting elements to emit light is provided in the array layer, the metal lines in the driving circuit can shield light, so in some embodiments, the second light-shielding layer may not adopt a whole surface for shielding light, light-shielder merely needs to be formed around the second imaging pin-holes, so that the metal lines in the array layer can be reused as the second light-shielding layer. Optionally, the second light-shielding layer is located within the array layer, the array layer includes multiple metal layers, at least a part of the metal layers includes multiple metal lines, at least one metal line forms the second imaging pin-holes, and one or more of the metal layers are reused as the second light-shielding layer.

For example, in some embodiments, a single metal line with a relatively wide width in the array layer may be used as the second light-shielding layer, and optionally, a first metal line 201 located in the array layer includes hollow structures, and the hollow structures form the second imaging pin-holes 71.

Figure 15:
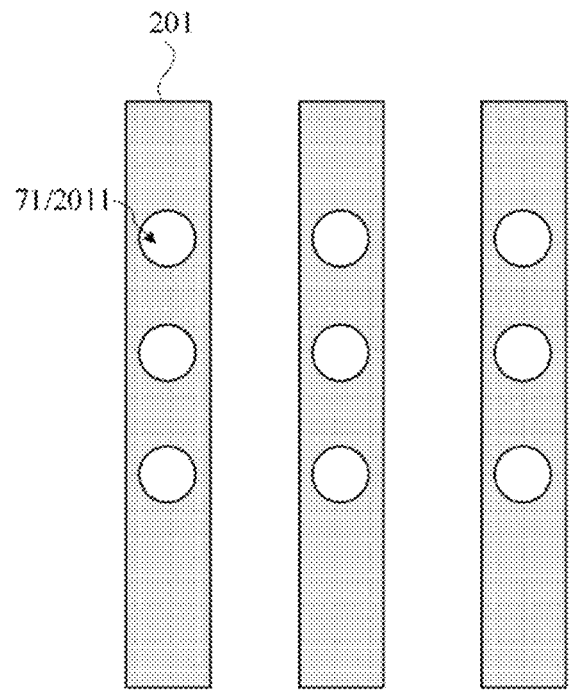
FIG. 15 is a structural diagram of a second light-shielding layer according to another embodiment of the present disclosure.

FIG. 15 is a structural diagram of a second light-shielding layer according to another exemplary embodiment of the present disclosure. FIG. 15 illustratively shows three first metal lines 201, where each first metal line is provided with the hollow structures 2011, and the hollow structures 2011 form the second imaging pin-holes 71. Specifically, in case of using a single metal line as the second light-shielding layer, a metal line with a relatively wide width should be selected to avoid trace deformation or disconnection when forming the hollow structures. Optionally, the first metal lines 201 may include data signal lines and/or power voltage signal lines and a selection may be made in specific implementation according to actual requirements.

Optionally, projections of partial regions of at least a part of the first metal lines 201 onto the base substrate include "8" shapes or ring shapes.

Figure 16:
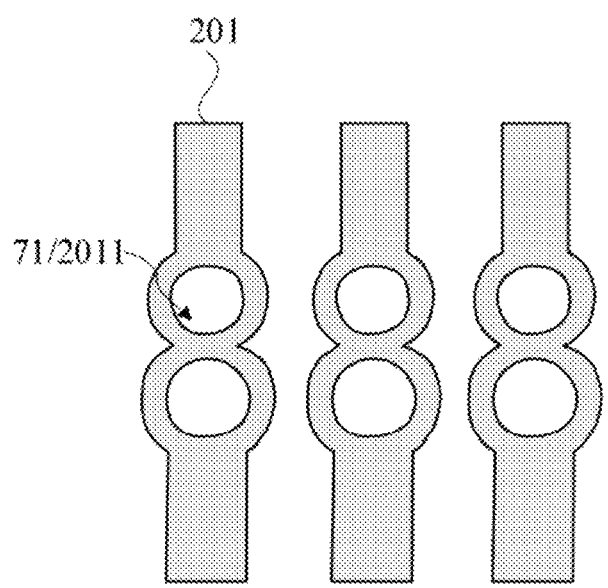
FIGS. 16 and 17 are structural diagrams of a second light-shielding layer according to another embodiment of the present disclosure.
Figure 17:
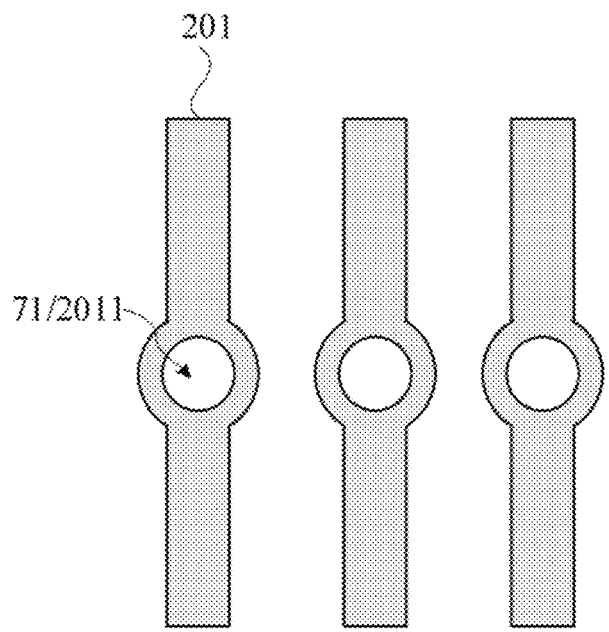

The edge of "8" shape or the edge of the ring shape forms a light-shielding portion at the edge of the second imaging pin-hole, and at least one hole in the "8" shape or the hole of the ring shape forms the second imaging pin-hole. FIGS. 16 and 17 are structural diagrams of a second light-shielding layer according to another exemplary embodiment of the present disclosure, where a partial region of the first metal line 201 is formed with an "8" shape in FIG. 16, and a partial region of the first metal line 201 is formed with a ring shape in FIG. 17. These designs can prevent the first metal lines 201 from disconnection. In other embodiments, "B" shapes or "D" shapes can also be formed, and the specific implementation can be designed according to the actual trace situations.

In other embodiments, metal lines located in different layers may be used for separately forming partial edges of the second imaging pin-holes 71, thereby forming the second imaging pin-holes 71. Optionally, the second metal lines 202 and the third metal lines 203 located in the array layer jointly form the second imaging pin-holes 71, where the second metal lines 202 and the third metal lines 203 are locate in different metal layers.

Figure 18:
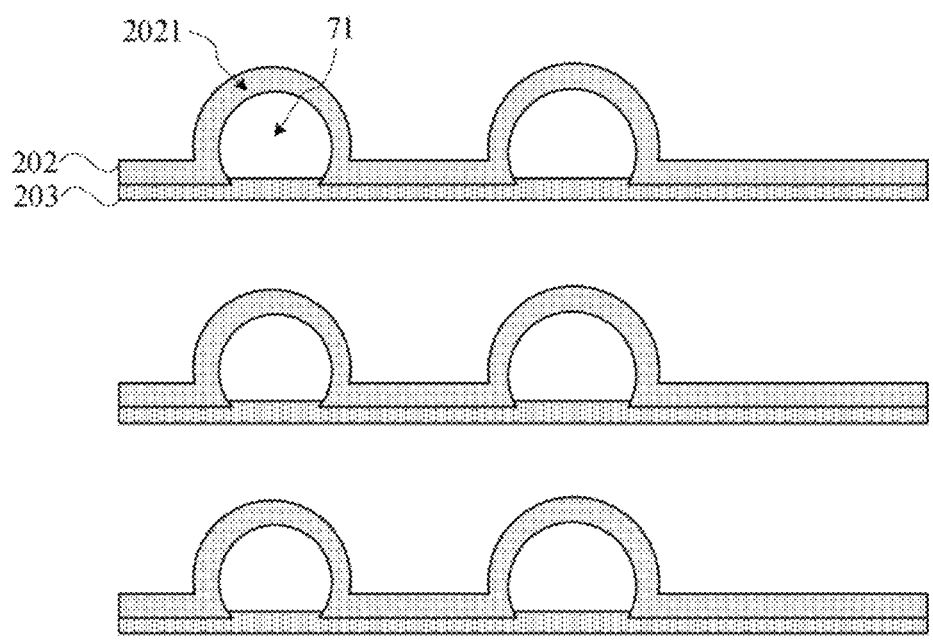
FIG. 18 is a structural diagram of a second light-shielding layer according to another embodiment of the present disclosure.

FIG. 18 is a structural diagram of a second light-shielding layer according to another exemplary embodiment of the present disclosure. Referring to FIG. 18, optionally, a projection of at least partial region of the second metal line 202 onto the base substrate is a first arc-shape 2021, and a first end of the first arc-shape 2021 and a second end of the first arc-shape 2021 respectively overlap one third metal line 203 to enclose one second imaging pin-hole 71.

In some embodiments, the width of a single metal line may not be sufficient to form hollow portions to serve as the second imaging pin-holes 71, therefore, two metal lines are respectively used to form partial edges of the second imaging pin-holes 71; the second metal lines 202 and the third metal lines 203 are located in different metal layers, and two metal layers are partially overlapped in the direction perpendicular to the base substrate, thus forming the second imaging pin-holes 71. In specific implementation, the second metal lines 202 and the third metal lines 203, which are relatively close to each other and are located in relatively close film layers, may be selected. Optionally, the second metal lines 202 and the third metal lines 203 may be located in two adjacent metal layers in the array layer, so that the difference in light-shielding effect of the two metal layers caused due to a relatively far distance between the two metal layers can be avoided. Since the distance between a scanning signal line and a reference voltage signal line is relatively close in general pixel circuit arrangement, optionally, the second metal lines 202 include the scanning signal lines and the third metal lines 203 include the reference voltage signal lines; or the second metal lines 202 include the reference voltage signal lines and the third metal lines 203 include the scanning signal lines, thus avoiding major changes to the trace layout of an existing pixel circuit.

Figure 19:
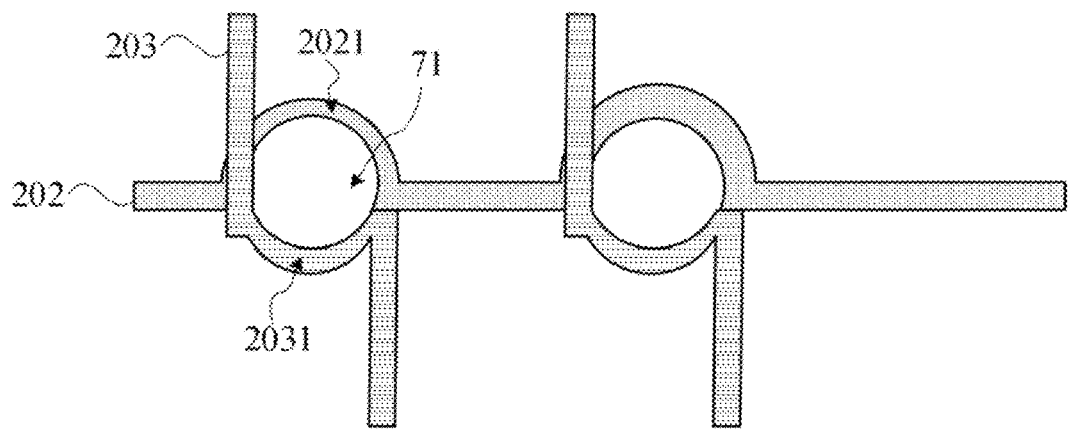
FIG. 19 is a structural diagram of a second light-shielding layer according to another embodiment of the present disclosure.

FIG. 19 is a structural diagram of a second light-shielding layer according to another exemplary embodiment of the present disclosure. Referring to FIG. 19, optionally, a projection of at least partial region of the second metal line 202 onto the base substrate is a first arc-shape 2021, and a projection of at least partial region of the third metal line 203 onto the base substrate is a second arc-shape 2031, where a first end of the first arc-shape 2021 and a first end of the second arc-shape 2031 are partially overlapped in the direction perpendicular to the base substrate, and a second end of the first arc-shape 2021 and a second end of the second arc-shape 2031 are partially overlapped in the direction perpendicular to the base substrate, so as to enclose and form the second imaging pin-hole 71.

It is understood that FIG. 19 shows a top view of the second light-shielding layer, the direction perpendicular to the base substrate is a direction perpendicular to the paper surface. The second imaging pin-holes 71 can be formed by two metal lines to achieve the fingerprint recognition based on the pin-hole imaging principle.

In the embodiment of FIG. 19, an extension direction of the second metal lines 202 intersects an extension direction of the third metal lines 203 (the extension direction refers to the overall extension direction of the traces). In another embodiment, optionally, the second metal lines 202 and the third metal lines 203 have the same extension direction. At least partial region of the second metal line 202 includes a wavy shape, and the second metal line 202 having the wavy shape includes multiple first arc-shape portions, where the multiple first arc-shape portions separately form partial edges of different second imaging pin-holes 71.

Figure 20:
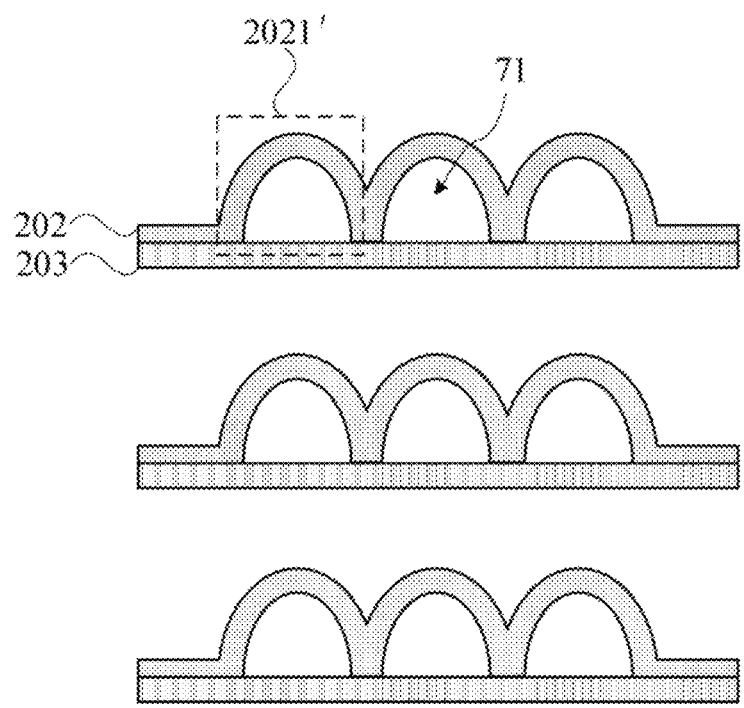
FIG. 20 is a structural diagram of a second light-shielding layer according to another embodiment of the present disclosure.
Figure 21:
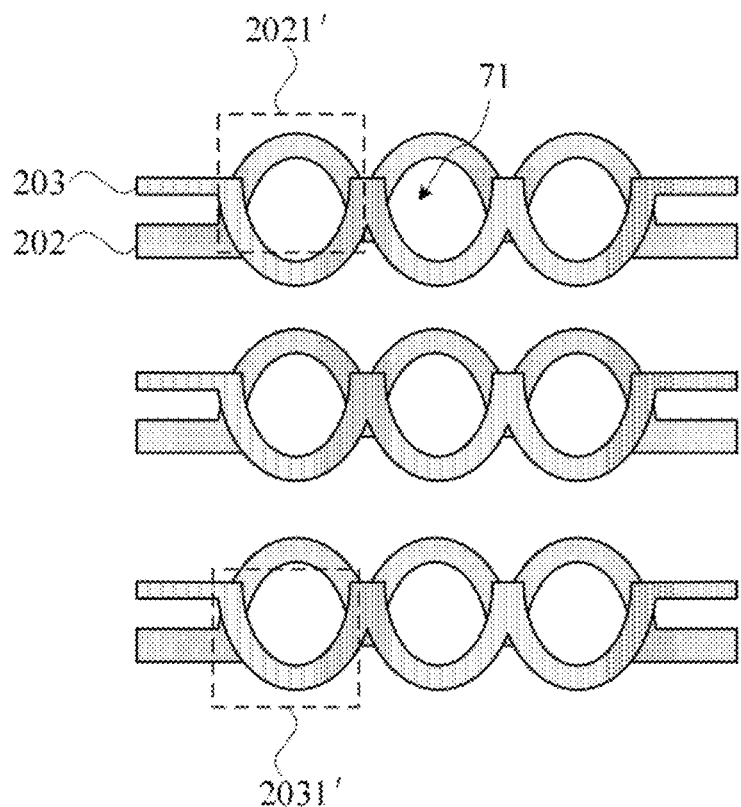
FIG. 21 is a structural diagram of a second light-shielding layer according to another embodiment of the present disclosure.

FIG. 20 is a structural diagram of a second light-shielding layer according to another exemplary embodiment of the present disclosure. Referring to FIG. 20, at least partial region of the second metal line 202 includes a wavy shape, and the the second metal line 202 having the wavy shape includes multiple first arc-shape portions 2021', where the multiple first arc-shape portions 2021' separately form partial edges of different second imaging pin-holes 71. In other embodiment, it is also possible to provide that partial region of the second metal line 202 and partial region of the third metal line 203 each include the wavy shape. FIG. 21 is a structural diagram of a second light-shielding layer according to another exemplary embodiment of the present disclosure. Referring to FIG. 21, at least partial region of the second metal line 202 includes a wavy shape, and the second metal line 202 having the wavy shape includes multiple first arc-shape portions 2021', where the multiple first arc-shape portions 2021' separately form partial edges of different second imaging pin-holes 71; and at least partial region of the third metal line 203 includes a wavy shape, and the third metal line 203 having the wavy shape includes multiple second arc-shape portions 2031', where the multiple second arc-shape portions 2031' separately form partial edges of different second imaging pin-holes 71.

Figure 22:
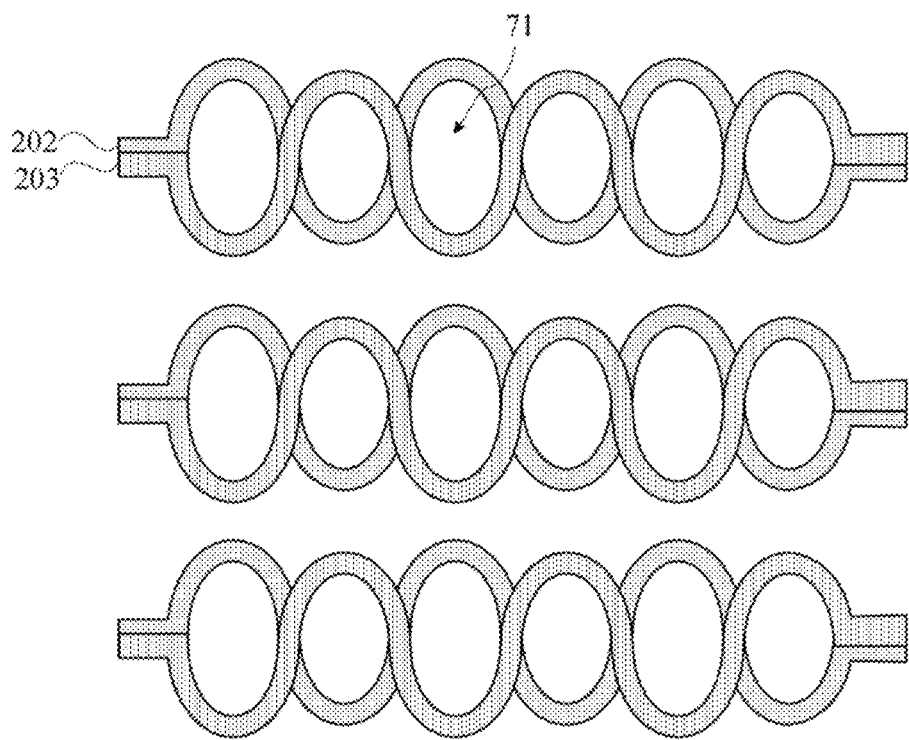
FIG. 22 is a structural diagram of a second light-shielding layer according to another embodiment of the present disclosure.

It is understood that since the second metal lines 202 and the third metal lines 203 are located in different metal layers, the light brightness at the side of metal lines which are closer to the touch surface of the display panel may differ from the brightness at the side of the other metal lines; hence, if edges at one side of the second imaging pin-holes are all formed by metal lines which are closer to the touch surface of the display panel, the light received by the light-sensing sensor may be uneven in brightness. FIG. 22 is a structural diagram of a second light-shielding layer according to another exemplary embodiment of the present disclosure. Different from FIG. 21, the second metal line 202 and the third metal line 203 alternately form edges on the same side of the second imaging pin-holes 71 to equalize the amount of light captured by the light-sensing sensor in each direction.

Optionally, the second metal line 202 having the wavy shape include at least first sub-arc lines and second sub-arc lines with different protruding directions, where the first sub-arc lines and the second sub-arc lines respectively form partial edges of different second imaging pin-holes 71.

Figure 23:
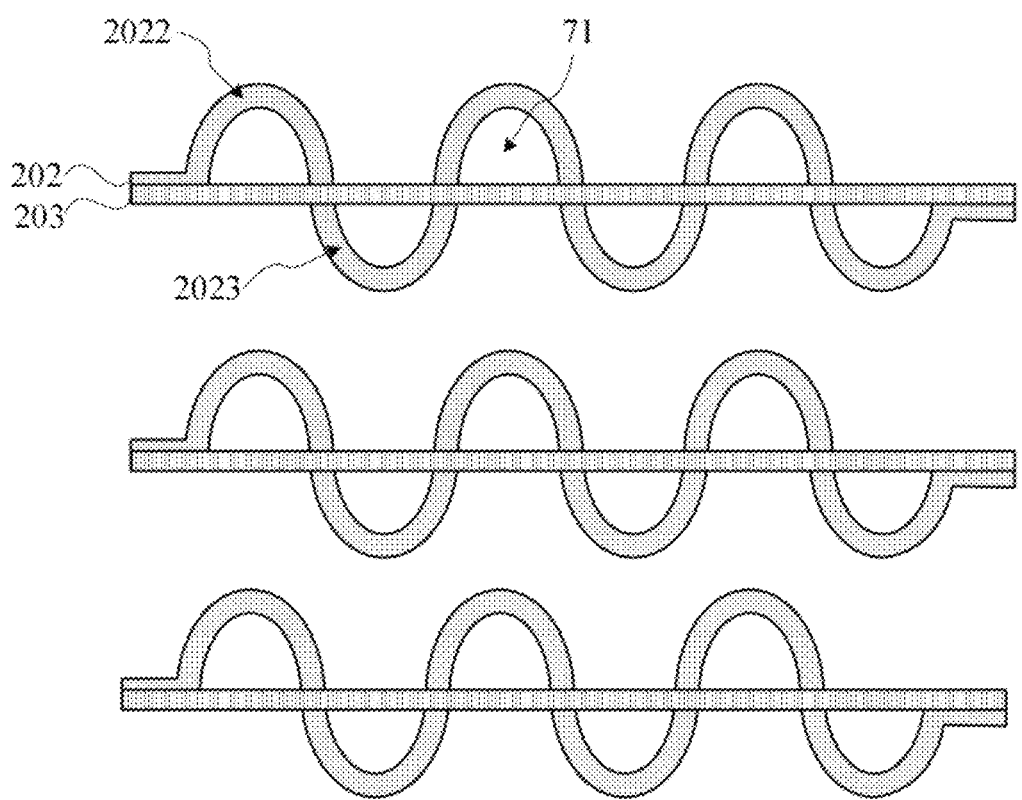
FIG. 23 is a structural diagram of a second light-shielding layer according to another embodiment of the present disclosure.

FIG. 23 is a structural diagram of a second light-shielding layer according to another exemplary embodiment of the present disclosure. The first sub-arc lines 2022 of the second metal line 202 and the second sub-arc lines 2023 of the second metal line 202 are located on two sides of the third metal line 203, respectively, to equalize the amount of light captured by the light-sensing sensor in each direction.

Figure 24:
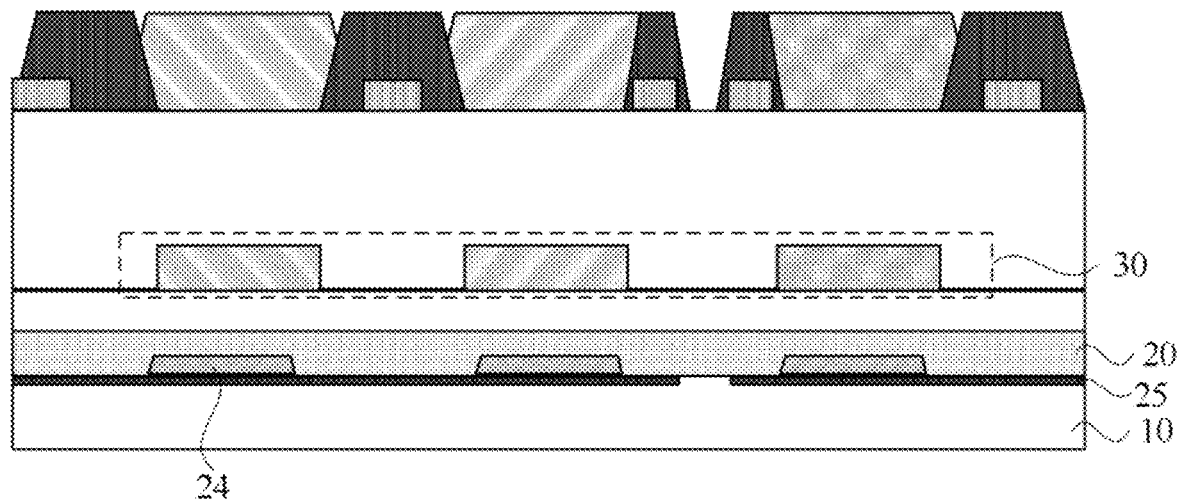
FIG. 24 is a structural diagram of a display panel according to another embodiment of the present disclosure.

FIG. 24 is a structural diagram of another display panel according to another exemplary embodiment of the present disclosure. Referring to FIG. 24, optionally, the array layer 20 includes a semiconductor layer 24 and a first metal layer 25 located at one side of the semiconductor layer 24 close to the base substrate 10. The first metal layer 25 covers the semiconductor layer 24 in a direction pointing from the base substrate 10 to the display layer 30. The first metal layer 25 is provided with multiple second imaging pin-holes.

It is understood that the semiconductor layer 24 is an active layer of a thin film transistor, and the first metal layer 25 has two functions, one is to shield the semiconductor layer 24 from possible influence on the semiconductor layer 24 due to light transmission from the side of the base substrate, and the other is to reuse as the second light-shielding layer to form the second imaging pin-holes for imaging.

Optionally, the light-sensing sensor layer is fully attached onto one side of the base substrate facing away from the array layer through an optical adhesive. The second light-shielding layer is located between the base substrate and the array layer, or the second light-shielding layer is located between the base substrate and the light-sensing sensor layer.

Figure 25:
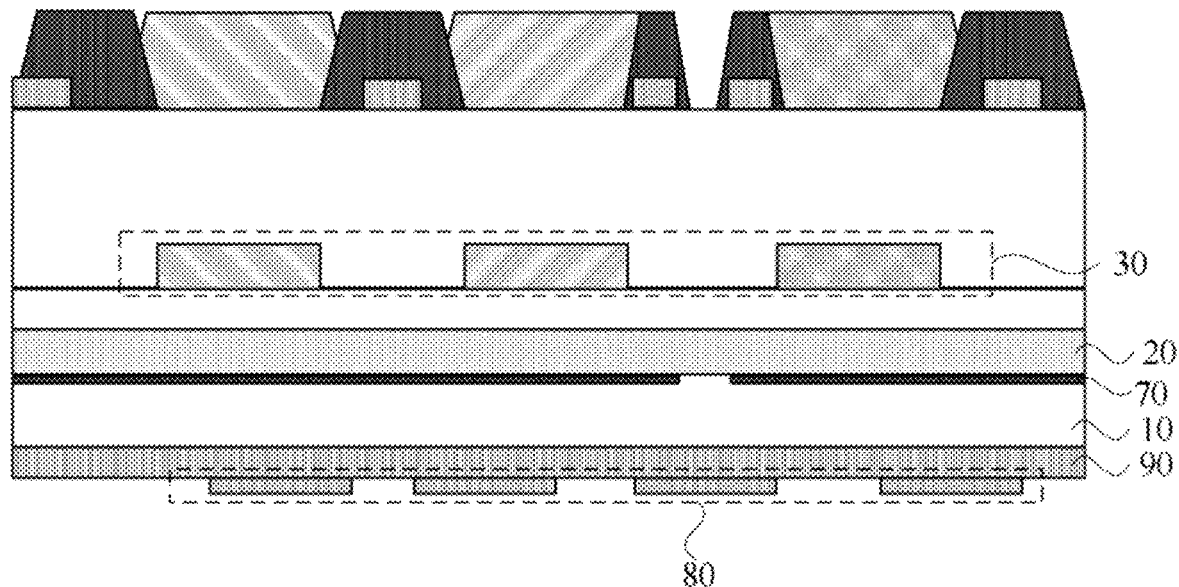
FIGS. 25 and 26 are structural diagrams of a display panel according to another embodiment of the present disclosure.
Figure 26:
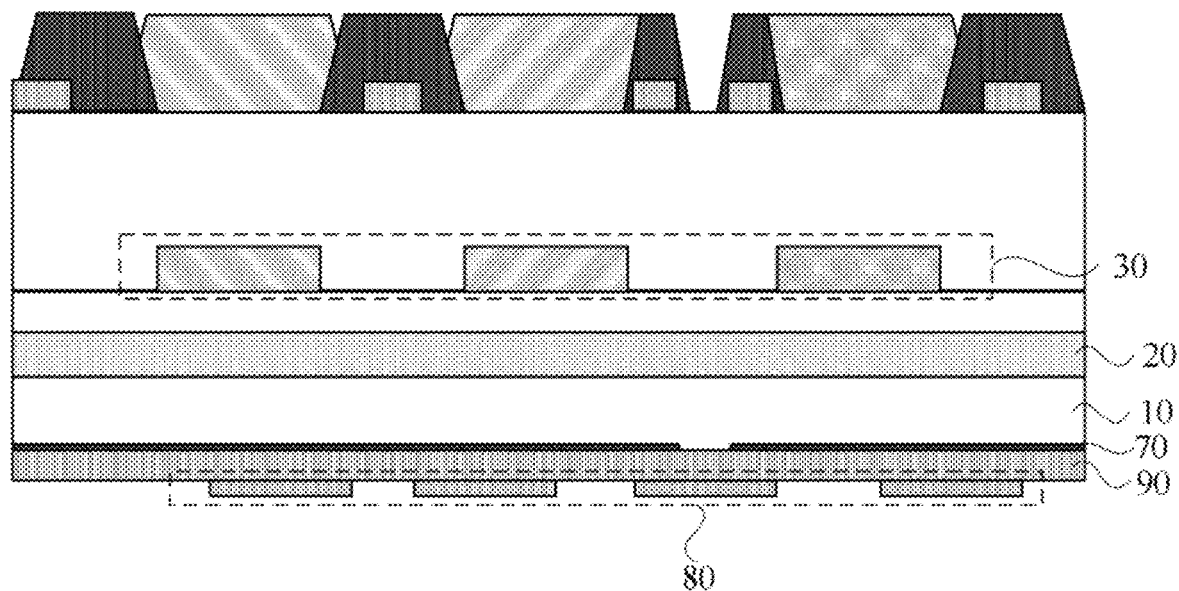

FIGS. 25 and 26 are structural diagrams of a display panel according to another exemplary embodiment of the present disclosure. Referring to FIGS. 25 and 26 concurrently, the light-sensing sensor layer 80 is fully attached onto one side of the base substrate 10 facing away from the array layer 20 through the optical adhesive 90. The second light-shielding layer 70 is located between the base substrate 10 and the array layer 20 in FIG. 25, and the second light-shielding layer 70 is located between the base substrate 10 and the light-sensing sensor layer 80 in FIG. 26. In other embodiments, for example, the base substrate includes a multi-layer structure, and the second light-shielding layer may also be set in the base substrate, which are not limited in the embodiments of the present disclosure.

Figure 27:
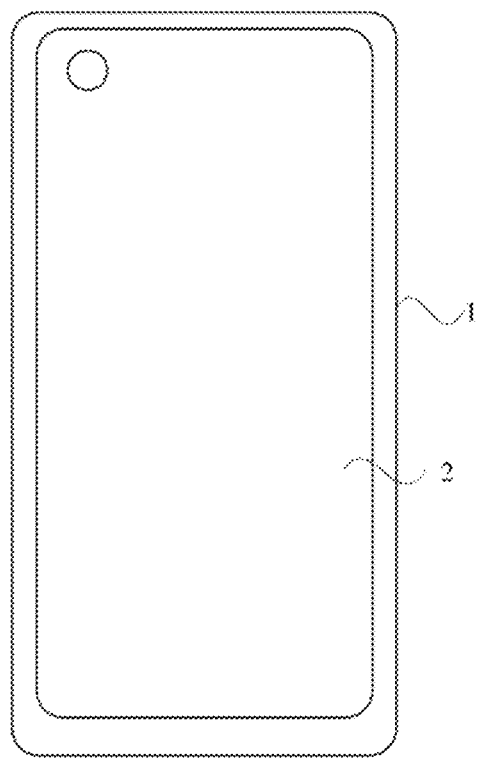
FIG. 27 is a structural diagram of a display device according to another embodiment of the present disclosure.

FIG. 27 is a structure diagram of a display device according to another exemplary embodiment of the present disclosure. Referring to FIG. 27, the display device 1 includes any one of the display panels 2 provided in the foregoing embodiments of the present disclosure. The display device 1 may be a mobile phone, a computer, an intelligent wearable device, etc.

It is understood that the preceding are only preferred embodiments of the present disclosure and the technical principles used therein. It will be appreciated by those skilled in the art that the present disclosure is not limited to the embodiments described herein. For those skilled in the art, various apparent modifications, adaptations, combinations and substitutions can be made without departing from the scope of the present disclosure. Therefore, while the present disclosure has been described in detail via the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising:
   a base substrate;
   an array layer located at one side of the base substrate;
   a display layer located at one side of the array layer facing away from the base substrate, wherein the display layer comprises a plurality of light-emitting elements;
   a color filter layer located at one side of the display layer facing away from the array layer, wherein the color filter layer comprises a first light-shielding layer and color resists, the first light-shielding layer comprises a plurality of first imaging pin-holes, and the color resists are disposed corresponding to the plurality of light-emitting elements;
   a touch layer located between the color filter layer and the display layer, wherein the first light-shielding layer shields the touch layer in a direction perpendicular to a plane where the base substrate is located;
   a second light-shielding layer located at one side of the display layer facing away from the color filter layer, wherein the second light-shielding layer comprises a plurality of second imaging pin-holes, and the plurality of second imaging pin-holes correspond to the plurality of first imaging pin-holes; and
   a light-sensing sensor layer, which is located at one side of the second light-shielding layer facing away from the display layer and is used for detecting images generated via the plurality of second imaging pin-holes;
   wherein a first imaging pin-hole of the plurality of first imaging pin-holes is larger than a second imaging pin-hole of the plurality of second imaging pin-holes, and a part of beams emitted by the light-emitting element serving as a pin-hole imaging light source are reflected by the touch layer adjacent to the first imaging pin-hole and then incident onto a region of the second light-shielding layer outside the second imaging pin-hole.

2. The display panel of claim 1, wherein the touch layer comprises at least one layer of touch electrodes, and each touch electrode comprises a touch pattern; and
   wherein a location relationship between the touch pattern adjacent to the first imaging pin-hole and the light-emitting element serving as the pin-hole imaging light source satisfies the following formula:

$$x \geq D + W + x_1;$$

wherein x denotes a distance between an edge of the touch pattern and an edge of the light-emitting element serving as the pin-hole imaging light source in a first direction, D denotes a width of the second imaging pin-hole in the first direction, W denotes a width of the touch pattern in the first direction, and $x_1$ denotes a distance between an edge of the touch pattern and the second imaging pin-hole in the first direction, the first direction being parallel to a plane where the second light-shielding layer is located.

3. The display panel of claim 2, wherein the distance x1 between the edge of the touch pattern and the second imaging pin-hole in the first direction satisfies the following formula:

$$x_1 \geq h \tan \gamma;$$

wherein $\gamma$ denotes an effective viewing angle in a case where imaging is performed via the second imaging pin-hole, and $$\tan \gamma = \frac{\sqrt{2} P}{2u},$$

wherein P denotes a distance between two adjacent second imaging pin-holes in the first direction, u denotes a distance between a touch surface and the second light-shielding layer in a second direction, and h denotes a distance between the touch pattern and the second light-shielding layer in the second direction, the second direction being perpendicular to the plane where the second light-shielding layer is located.

4. The display panel of claim 1, wherein the touch layer comprises at least one layer of touch electrodes, and each touch electrode comprises a touch pattern; and
   wherein a location relationship between the touch pattern adjacent to the first imaging pin-hole and the light-emitting element serving as the pin-hole imaging light source satisfies the following formula:

$$x \geq D + W + h \cdot \tan \theta;$$

wherein x denotes a distance between an edge of the touch pattern and an edge of the light-emitting element serving as the pin-hole imaging light source in a first direction, D denotes a width of the second imaging pin-hole in the first direction, W denotes a width of the touch pattern in the first direction, h denotes a distance between the touch pattern and the second light-shielding layer in a second direction, and θ denotes a critical angle at which a beam incident onto a surface of a first dielectric layer far away from a photosensitive surface of the light-sensing sensor layer is totally reflected, wherein the first dielectric layer is a film layer adjacent to the photosensitive surface of the light-sensing sensor layer, the first direction is parallel to a plane where the second light-shielding layer is located and the second direction is perpendicular to the plane where the second light-shielding layer is located.

5. The display panel of claim 4, wherein the first dielectric layer is an air layer.

6. The display panel of claim 1, wherein the display layer comprises light-emitting elements with at least three light-emitting colors, light-emitting elements with one light-emitting color are served as pin-hole imaging light sources, and the plurality of second imaging pin-holes and the plurality of first imaging pin-holes are located between light-emitting elements having different light-emitting colors from the light-emitting elements served as the pin-hole imaging light sources.

7. The display panel of claim 6, wherein the light-emitting elements comprise red light-emitting elements, green light-emitting elements and blue light-emitting elements, and the green light-emitting elements are served as the pin-hole imaging light sources.

8. The display panel of claim 1, wherein color resists of at least one color extend between the touch layer and the display layer; and
wherein a color of a color resist material between at least part of the touch layer and the display layer is different from the light-emitting color of the light-emitting elements serving as the pin-hole imaging light sources.

9. The display panel of claim 8, wherein color resists of two colors are adjacent to an identical first imaging pin-hole, the color resists of the two colors are located between the touch layer and the display layer and stacked in a direction perpendicular to the plane where the base substrate is located, and colors of the color resists of the two colors are different from the light-emitting color of the light-emitting elements serving as the pin-hole imaging light sources.

10. The display panel of claim 8, wherein the at least part of the touch layer is covered by the color resist of the at least one color, and the color resist of the at least one color covers at least a part of a sidewall of the first imaging pin-hole.

11. The display panel of claim 8, wherein the color resist of the at least one color at least partially covers the touch layer in a direction pointing from the base substrate to the display layer.

12. The display panel of claim 11, wherein a width of the touch pattern adjacent to the first imaging pin-hole is less than a width of the color resist of the at least one color between the touch pattern and the display layer.

13. The display panel of claim 1, wherein the touch layer comprises a plurality of mesh-shaped touch electrodes, and the plurality of mesh-shaped touch electrodes comprise a plurality of intersecting metal lines.

14. The display panel of claim 1, wherein the second light-shielding layer is located between the display layer and the array layer.

15. The display panel of claim 1, wherein the second light-shielding layer is located within the array layer and the array layer comprises a plurality of metal layers, wherein at least a part of the plurality of metal layers comprises a plurality of metal lines, at least one metal line forms the second imaging pin-holes, and one or more of the plurality of metal layers are reused as the second light-shielding layer.

16. The display panel of claim 15, wherein first metal lines located in the array layer comprise hollow structures, and the hollow structures form the plurality of second imaging pin-holes.

17. The display panel of claim 15, wherein second metal lines and third metal lines located in the array layer jointly form the plurality of second imaging pin-holes;
wherein the second metal lines and the third metal lines are located in different metal layers.

18. The display panel of claim 15, wherein the array layer comprises a semiconductor layer and a first metal layer located at one side of the semiconductor layer close to the base substrate, and the first metal layer covers the semiconductor layer in a direction pointing from the base substrate to the display layer; and
wherein the first metal layer is provided with the plurality of second imaging pin-holes.

19. The display panel of claim 1, wherein the light-sensing sensor layer is fully attached onto one side of the base substrate facing away from the array layer through an optical adhesive; and
wherein the second light-shielding layer is located between the base substrate and the array layer, or the second light-shielding layer is located between the base substrate and the light-sensing sensor layer.

20. A display device, comprising a display panel, wherein the display panel comprises:
a base substrate;
an array layer located at one side of the base substrate;
a display layer located at one side of the array layer facing away from the base substrate, wherein the display layer comprises a plurality of light-emitting elements;
a color filter layer located at one side of the display layer facing away from the array layer, wherein the color filter layer comprises a first light-shielding layer and color resists, the first light-shielding layer comprises a plurality of first imaging pin-holes, and the color resists are disposed corresponding to the plurality of light-emitting elements;
a touch layer located between the color filter layer and the display layer, wherein the first light-shielding layer shields the touch layer in a direction perpendicular to a plane where the base substrate is located;
a second light-shielding layer located at one side of the display layer facing away from the color filter layer, wherein the second light-shielding layer comprises a plurality of second imaging pin-holes, and the plurality of second imaging pin-holes correspond to the plurality of first imaging pin-holes; and
a light-sensing sensor layer, which is located at one side of the second light-shielding layer facing away from the display layer and is used for detecting images generated via the plurality of second imaging pin-holes;
wherein a first imaging pin-hole of the plurality of first imaging pin-holes is larger than a second imaging pin-hole of the plurality of second imaging pin-holes, and a part of beams emitted by the light-emitting element serving as a pin-hole imaging light source are reflected by the touch layer adjacent to the first imaging pin-hole and then incident onto a region of the second light-shielding layer outside the second imaging pin-hole.

* * * * *